(12) United States Patent
Kwack et al.

(10) Patent No.: US 8,454,847 B2
(45) Date of Patent: Jun. 4, 2013

(54) METHOD OF LIFTING OFF AND FABRICATING ARRAY SUBSTRATE FOR LIQUID CRYSTAL DISPLAY DEVICE USING THE SAME

(75) Inventors: Hee-Young Kwack, Seoul (KR); Hyun-Seok Hong, Goyang-si (KR); Joo-Soo Lim, Gumi-si (KR); Hong-Sik Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/165,466

(22) Filed: Jun. 21, 2011

(65) Prior Publication Data
US 2011/0250532 A1 Oct. 13, 2011

Related U.S. Application Data

(62) Division of application No. 12/219,306, filed on Jul. 18, 2008, now Pat. No. 7,988,871.

(30) Foreign Application Priority Data

Jul. 20, 2007 (KR) .................. 10-2007-0073055
May 21, 2008 (KR) .................. 10-2008-0046998

(51) Int. Cl.
*C03B 33/00* (2006.01)

(52) U.S. Cl.
USPC .................. 216/23; 216/40; 216/47; 216/75

(58) Field of Classification Search
USPC .................. 216/23, 40, 47, 75
See application file for complete search history.

(56) References Cited

U.S. PATENT DOCUMENTS

| 2006/0113539 | A1  | 6/2006  | Sano et al. | |
| 2006/0160340 | A1  | 7/2006  | Takei et al. | |
| 2007/0259521 | A1* | 11/2007 | Oh et al. | 438/655 |
| 2008/0014665 | A1* | 1/2008  | Kim | 438/30 |
| 2008/0067603 | A1* | 3/2008  | Choung et al. | 257/365 |
| 2008/0122767 | A1* | 5/2008  | Lim et al. | 345/87 |
| 2008/0157080 | A1* | 7/2008  | Gruner et al. | 257/59 |

* cited by examiner

*Primary Examiner* — Binh X Tran
(74) *Attorney, Agent, or Firm* — McKenna Long & Aldridge, LLP

(57) ABSTRACT

A method of lifting off includes forming a first material layer on a substrate; forming a photoresist pattern including first and second holes and on the first material layer; patterning the first material layer using the photoresist pattern as a patterning mask to form a material pattern having first and second grooves within the material pattern, the first and second grooves corresponding to the first and second holes, respectively; forming a second material layer on an entire surface of the substrate including the photoresist pattern and the first and second grooves; and removing the photoresist pattern and the second material layer on the photoresist pattern at the same time, wherein a portion of the material pattern between the first and second grooves and portions of the material pattern at sides of the first and second grooves constitute a line as a whole.

11 Claims, 33 Drawing Sheets

METHOD OF LIFTING OFF AND FABRICATING ARRAY SUBSTRATE FOR LIQUID CRYSTAL DISPLAY DEVICE USING THE SAME

CROSS-REFERENCE TO RELATED APPLICATIONS

This application is a Divisional of application Ser. No. 12/219,306 filed Jul. 18, 2008, now U.S. Pat. No. 7,988,871, which claims priority to Korean Patent Application No. 10-2007-0073055, filed Jul. 20, 2007, and Korean Patent Application No. 10-2008-0046998, filed May 21, 2008 all of which are incorporated by reference in their entirety for all purposes as if fully set forth herein.

BACKGROUND OF THE INVENTION

1. Field of the Invention

The present invention relates to a liquid crystal display device, and more particularly, to a method of lifting off and a method of fabricating an array substrate for a liquid crystal display (LCD) device using the same being capable of preventing degrading of image qualities.

2. Discussion of the Related Art

A related art liquid crystal display (LCD) device uses optical anisotropy and polarization properties of liquid crystal molecules. The liquid crystal molecules have a definite alignment direction as a result of their thin and long shapes. The alignment direction of the liquid crystal molecules can be controlled by applying an electric field across the liquid crystal molecules. In other words, as the intensity or direction of the electric field is changed, the alignment of the liquid crystal molecules also changes. Since incident light is refracted based on the orientation of the liquid crystal molecules due to the optical anisotropy of the liquid crystal molecules, images can be displayed by controlling light transmissivity.

Since the LCD device including a thin film transistor (TFT) as a switching element, referred to as an active matrix LCD (AM-LCD) device, has excellent characteristics of high resolution and displaying moving images, the AM-LCD device has been widely used.

FIG. 1 is a plan view showing an array substrate for a related art LCD device. In the LCD device in FIG. 1, both a pixel electrode and a common electrode are disposed on the array substrate. It may be referred to as an in-plane switching (IPS) mode LCD device.

As shown in FIG. 1, the array substrate 10 includes a display region DR and a non-display region NDR at periphery of the display region DR. The display region DR functions as an image display region depending on change of arrangement of liquid crystal molecules. A plurality of gate lines 20 and a plurality of data lines 30 are formed on the array substrate 10. The plurality of gate lines 20 and the plurality of data lines 30 cross each other such that a plurality of pixel regions are defined. Moreover, a plurality of common lines 50 are formed on the array substrate 10. The common line 50 is parallel to and spaced apart from the gate line 20. A common signal is applied to the common line 50 through a common connection line 70 in the non-display region NDR.

If the common connection line 70 is formed of the same layer as the gate line 20, there is a problem of short between the gate lines 20. Accordingly, the common connection line 70 is formed of the same layer as the data line 30. The common connection line 70 is connected to the common line 50 through the common contact hole CMH.

In each pixel region, a pixel electrode (not shown), a common electrode (not shown) and a thin film transistor (TFT) T are disposed. The pixel electrode (not shown) and the common electrode (not shown) are alternately arranged with each other. The TFT T is disposed at a crossing portion of the gate and data lines 20 and 30 and consists of a gate electrode extending from the gate line 20, a semiconductor layer, a source electrode extending from the data line 30 and a drain electrode spaced apart from the source electrode.

A gate pad electrode 42 is disposed at one end of the gate line 20, and a data pad electrode 44 is disposed at one end of the data line 30. The gate pad electrode 42 and the data pad electrode 44 are connected to a gate driving unit (not shown) and a data driving unit (not shown) through a gate tape carrier package (TCP) (not shown) and a data TCP (not shown), respectively. In addition, although not shown, a static electricity protecting circuit line (not shown) and various signal lines are disposed at the non-display region NDR.

The common connection line 70 transfers a common signal from a common signal generating unit (not shown) to a plurality of common lines 50 in the display region DR. Accordingly, the common connection line 70 has a width greater than each common line 50.

On the other hand, to reduce mask process steps, a lift-off method is introduced. However, since various signal lines and metal patterns, for example, the common connection line 70, the gate pad electrode 42, the data pad electrode 44, a static electricity protecting circuit line (not shown), a multi pattern search (MPS) (not shown) line for detecting a short problem and a dummy line (not shown), have a relatively big width, there are some problems in the lift-off method. Particularly, since a stripper for removing a photoresist (PR) pattern with a layer on the PR pattern does not penetrate into a center portion of the above the signal lines and the metal patterns, the PR pattern undesirably remains.

The above problems are explained with reference to accompanied drawings. FIG. 2 is an enlarged plan view of an "A" portion in FIG. 1, and FIGS. 3A to 3C are cross-sectional views showing a fabricating process of a portion taken along the line III-III in FIG. 2. FIGS. 2 and 3A to 3C show the common connection line, while the problems may be also generated in the various signal lines and the metal lines, for example, the gate pad electrode, the data pad electrode, the static electricity protecting circuit line, the multi pattern search (MPS) line and the dummy line in the non-display region.

The line 70 is fabricated by a lifting off process in FIG. 2. Since stripper used for a lifting off process easily penetrates into edge portions D and E of a photosensitive pattern, such as a photoresist (PR) pattern, on the line 70, the photosensitive pattern is perfectly removed. However, it is difficult for the stripper to penetrate into a central portion F. Hereinafter, a photosensitive layer and the photosensitive pattern are referred to as a PR layer and a PR pattern, respectively. Accordingly, the photosensitive pattern remains after the lifting off process. The remaining photosensitive pattern causes a bad effect on following processes or image displaying qualities. When the line has a relative great width, there are serious problems.

The problems of the lifting off process are explained in more detail. As shown in FIG. 3A, a gate insulating layer 45 is formed on a substrate 10. In a non-display region NDR, a metal layer 60 is formed on the gate insulating layer 45, and a PR pattern 82 corresponding to a portion of the metal layer 60 is formed on the metal layer 60.

Next, as shown in FIG. 3B, the metal layer 60 (of FIG. 3A) is etched using the PR pattern 82 as an etching mask to form the line 70 and exposed a portion of the gate insulating layer 45. Since the metal layer 60 (of FIG. 3A) is over-etched, a width of the PR pattern 82 is greater than that of the line 70. Then, a layer 50, for example, a passivation layer, is formed on the PR pattern 82 and the exposed gate insulating layer 45. As mentioned above, since the PR pattern 82 has a greater width than the line 70 due to over-etching, there are discontinuation in the layer 50 at boundary portion between the PR pattern 82 and the line 70.

Next, as shown in FIG. 3C, the stripper is penetrated into the discontinuous portion of the layer 50 to perform a lifting off process. As a result, the PR pattern 82 and the layer 50 directly on the PR pattern 82 are removed at the same time. In this case, since the stripper easily penetrates into edge portions D and E of the line, the PR pattern 82 and the layer 50 directly on the PR pattern 82 at the edge portions D and E are perfectly removed. However, the stripper is difficult to be penetrated into a central portion F of the line 70, the PR pattern 82 and the layer 50 directly on the PR pattern 82 at a central portion F is scarcely moved. The PR remaining PR pattern 82 causes a bad effect.

On the other hand, there are first to fourth non-display regions in the array substrate. For example, the gate pad and the data pad are formed in the first and second non-display regions, respectively. When a material layer of a pixel electrode is formed in the third and fourth regions, there are some problems such as a short on adjacent pixel regions and corrosion. However, since the non-display regions have a relatively greater width, a PR pattern and the material layer of the pixel electrode remain such that image displaying qualities are degraded.

SUMMARY OF THE INVENTION

Accordingly, the present invention is directed to methods of lifting off and fabricating an array substrate for a liquid crystal display device using the same that substantially obviate one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a method of lifting off includes forming a first material layer on a substrate; forming a photoresist pattern including first and second holes and on the first material layer; patterning the first material layer using the photoresist pattern as a patterning mask to form a material pattern having first and second grooves within the material pattern, the first and second grooves corresponding to the first and second holes, respectively; forming a second material layer on an entire surface of the substrate including the photoresist pattern and the first and second grooves; and removing the photoresist pattern and the second material layer on the photoresist pattern at the same time, wherein a portion of the material pattern between the first and second grooves and portions of the material pattern at sides of the first and second grooves constitute a line as a whole.

In another aspect of the present invention, a method of fabricating an array substrate for a liquid crystal display device includes forming a gate line and a gate electrode on a substrate having a display region and first to fourth non-display regions at periphery of the display region, the gate electrode being disposed in the display region; forming a data line, a data pad, a semiconductor layer, a source electrode and a drain electrode, the data line crossing the gate line, the data pad disposed at one end of the data line and in the first non-display region, the semiconductor layer disposed over the gate electrode, the source electrode connected to the data line and disposed on the semiconductor layer, the drain electrode spaced apart from the source electrode and disposed on the semiconductor layer; forming an insulting material layer over an entire surface of the substrate including the data line, the data pad, the source electrode and the drain electrode; forming a first photoresist pattern corresponding to the source and drain electrode, and a second photoresist pattern having first and second holes, the first photoresist pattern exposing a portion of the drain electrode, the first and second holes respectively corresponding to first and second portions of the data pad; patterning the insulating material layer using the first and second photoresist patterns as a patterning mask to form a passivation layer exposing the portion of the drain electrode and a first passivation pattern having first and second grooves, the first and second grooves exposing the first and second portions of the data pad, respectively; forming a transparent conductive material layer over an entire surface of the substrate including the first and second photoresist patterns, the passivation layer and the a first passivation pattern; and removing the first and second photoresist patterns and the transparent conductive material layer on the first and second photoresist patterns at the same time by a lifting off process.

In another aspect of the present invention, a method of fabricating an array substrate for a liquid crystal display device includes forming a gate line and a gate pad on a substrate, the gate pad disposed at one end of the gate line; sequentially forming a gate insulating layer, an intrinsic amorphous silicon layer, an impurity-doped amorphous silicon layer and a metal layer over an entire surface of the substrate including the gate line and the gate pad; patterning the metal layer, the impurity-doped amorphous silicon layer, the intrinsic amorphous silicon layer and the gate insulating layer to expose the gate pad and form a data line crossing the gate line to define a pixel region and a data pad disposed at one end of the data line; forming a transparent conductive material layer over an entire surface of the substrate including the data line and the data pad; forming a first photoresist pattern including first and second holes and a second photoresist pattern including third and fourth holes, the first and second holes corresponding to first and second portions of the gate pad, respectively, the second and fourth holes corresponding to third and fourth portions of the data pad, respectively; patterning the transparent conductive material layer using the first and second photoresist patterns as a patterning mask to form a first transparent conductive material pattern having first and second grooves and a second transparent conductive material pattern having third and fourth grooves, the first and second grooves exposing the first and second portions, respectively, of the gate pad, the third and fourth grooves exposing the third and fourth portions, respectively, of the data pad; forming a passivation layer over an entire surface of the substrate including the first and second photoresist patterns and the first, second, third and fourth grooves; and removing the first and second photoresist patterns and the passivation layer on the first and second photoresist patterns at the same time by a lifting off process.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Reference will now be made in detail to embodiments of the present invention, examples of which are illustrated in the accompanying drawings.

Figure 1:
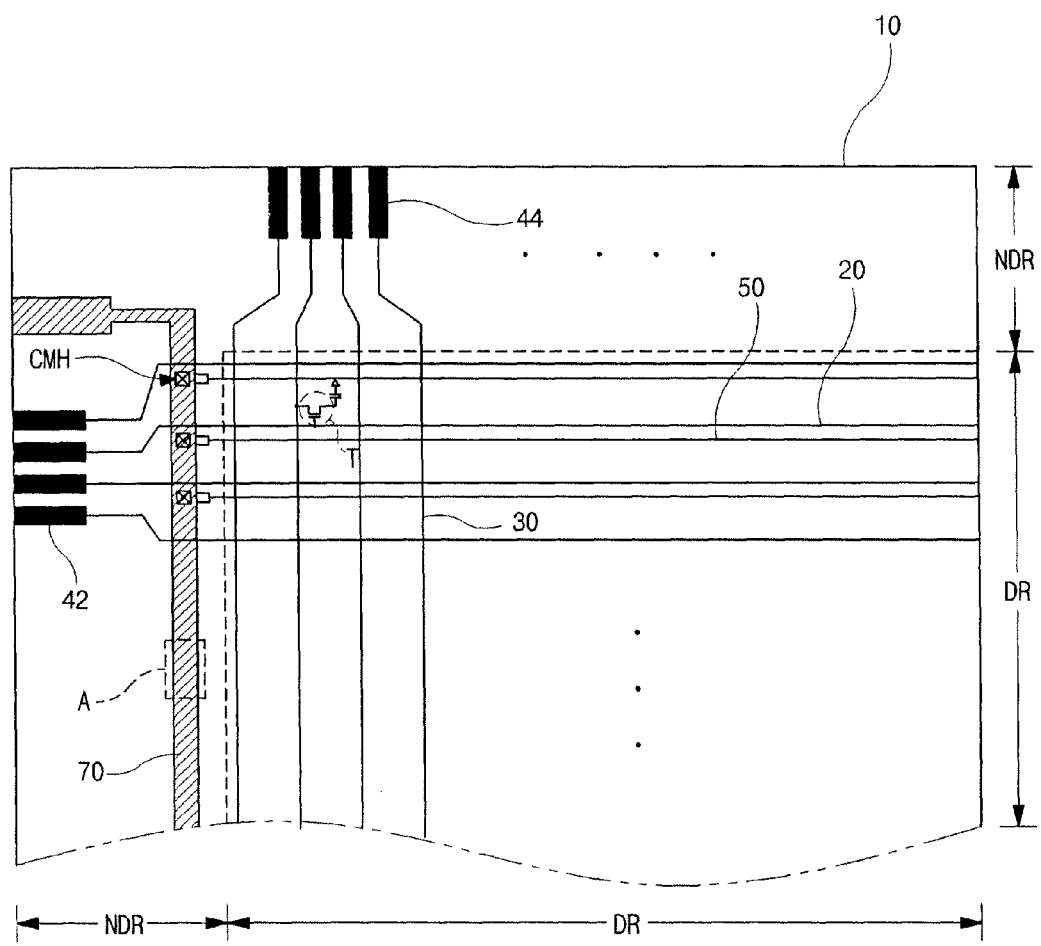
FIG. 1 is a plan view showing an array substrate for a related art LCD device.
Figure 2:
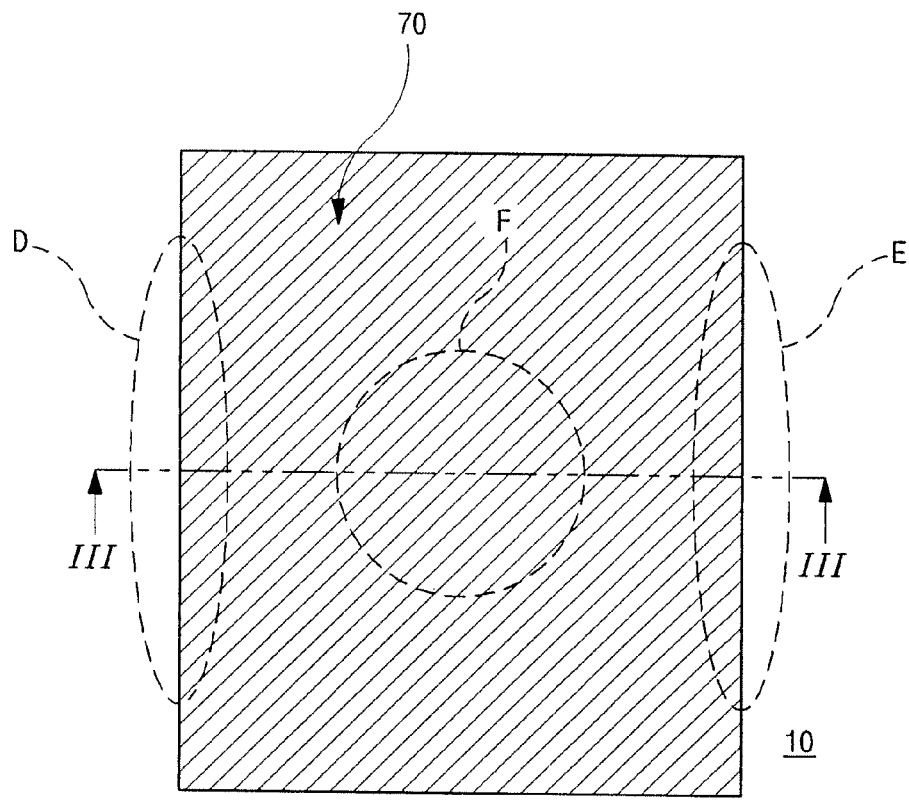
FIG. 2 is an enlarged plan view of an "A" portion in FIG. 1.
Figure 3A:
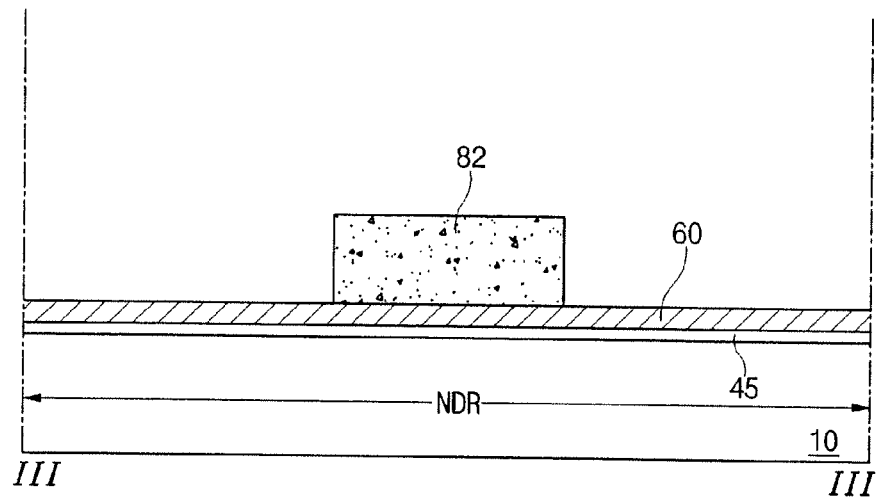
FIGS. 3A to 3C are cross-sectional views showing a fabricating process of a portion taken along the line in FIG. 2.
Figure 3B:
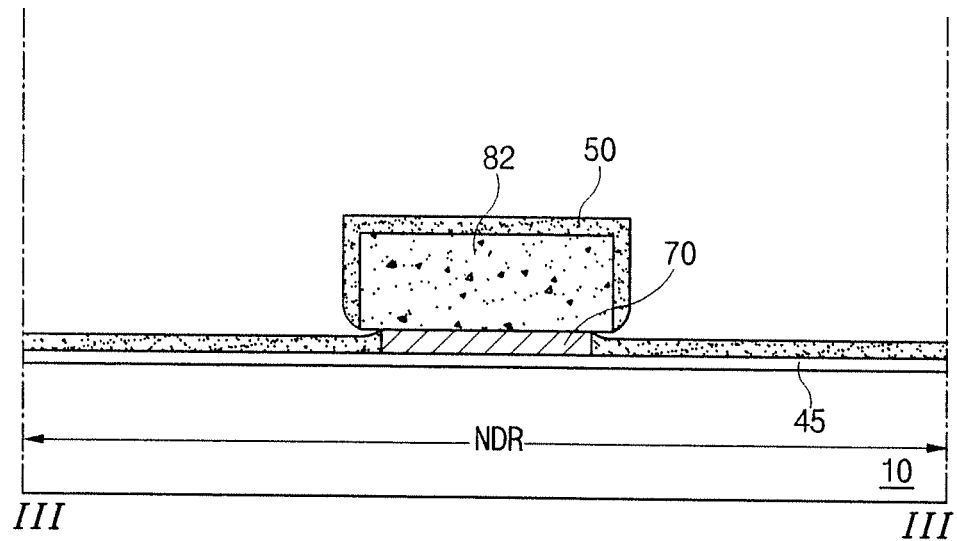
Figure 3C:
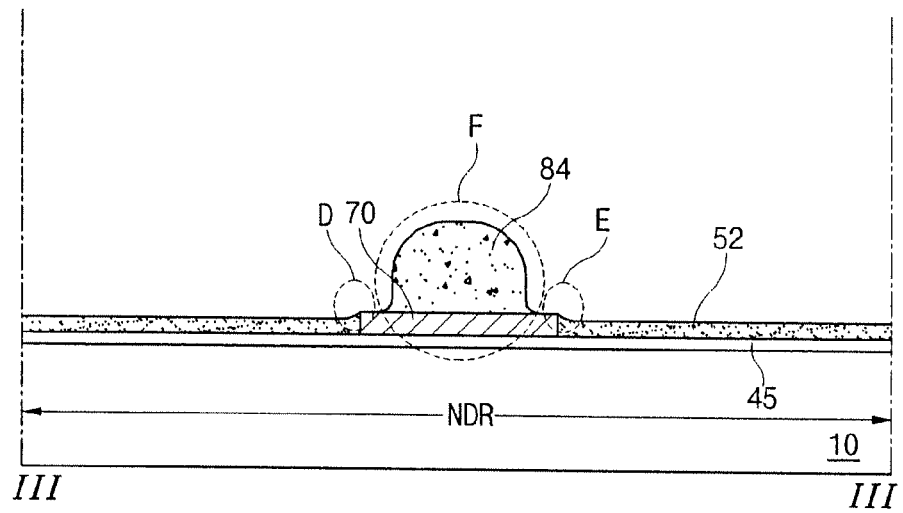
Figure 4:
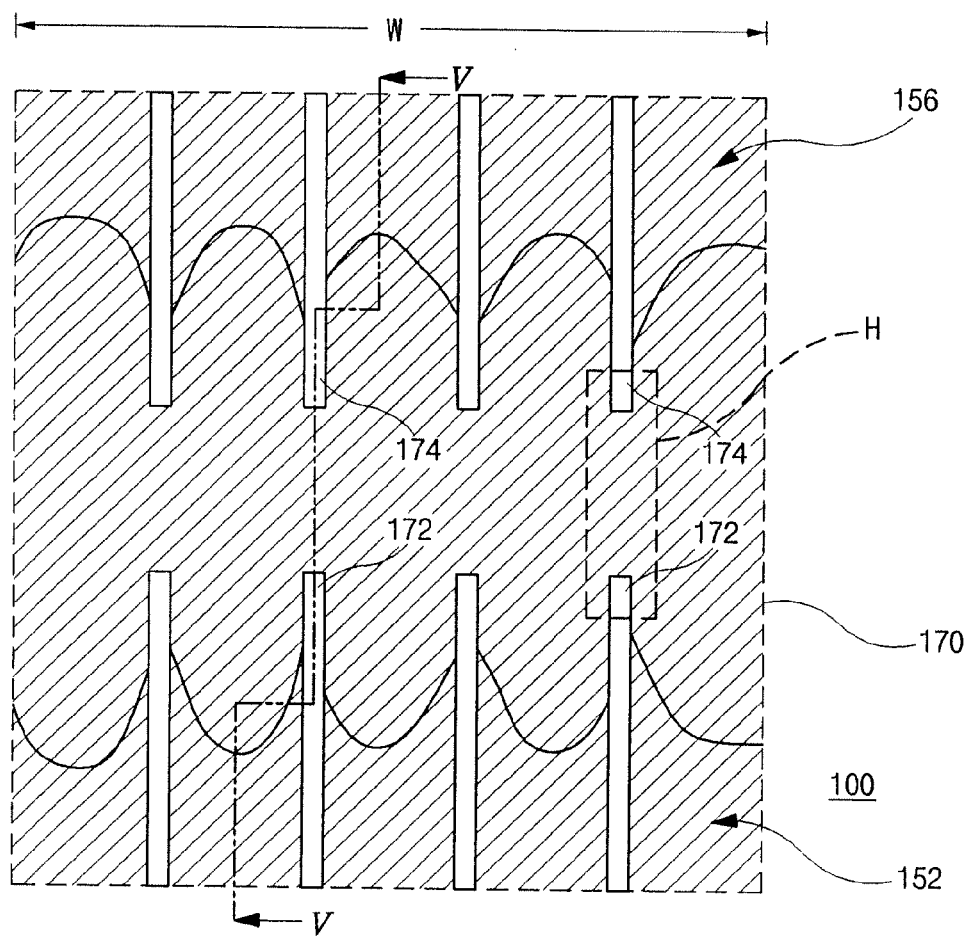
FIG. 4 is a plane view showing a portion of a line including a groove according to the present invention.
Figure 5A:
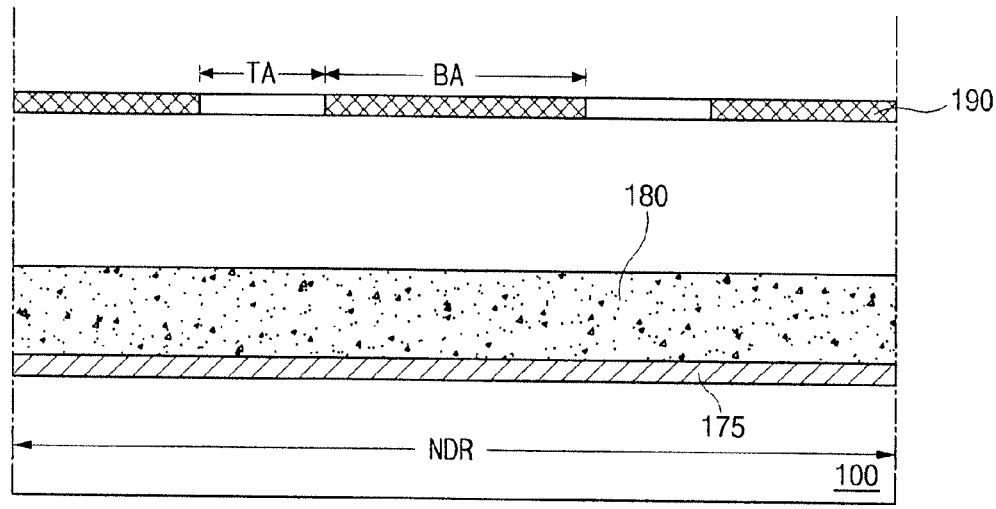
FIGS. 5A to 5C are cross-sectional views showing a fabricating process of a portion taken along the line V-V in FIG. 4.
Figure 5B:
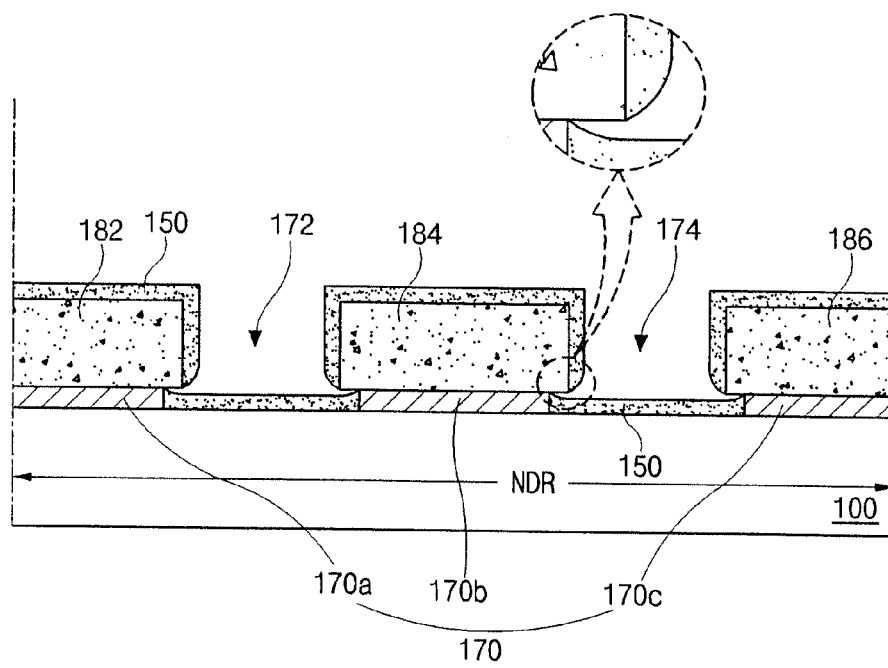
Figure 5C:
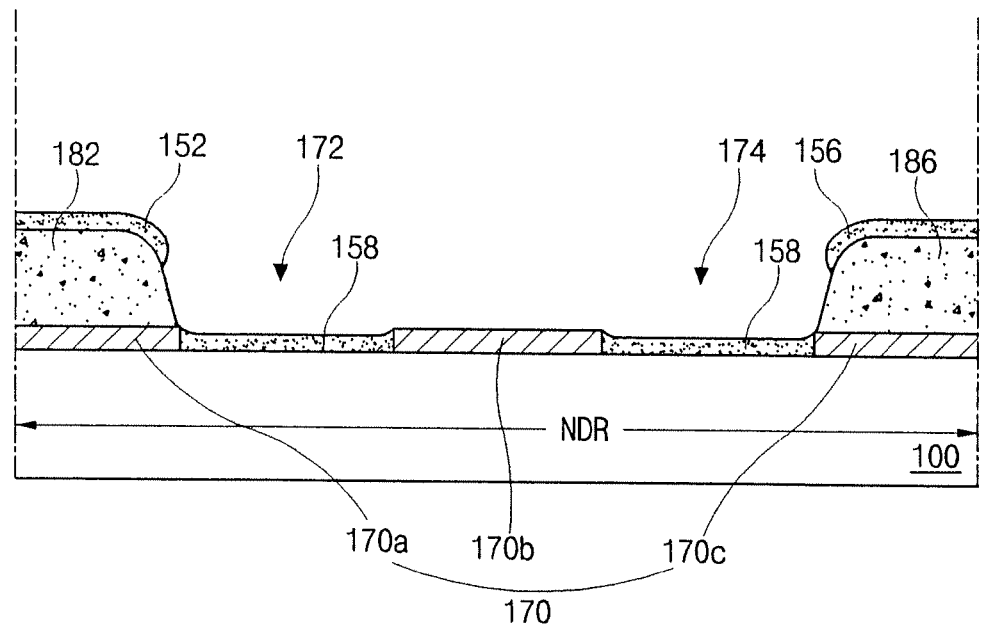

FIG. 4 is a plane view showing a portion of a line including a groove according to the present invention, and FIGS. 5A to 5C are cross-sectional views showing a fabricating process of a portion taken along the line V-V in FIG. 4.

As shown in FIG. 4, a plurality of first grooves 172 and a plurality of second grooves 174 are formed on a line 170. Each of the first and second grooves 172 and 174 has a bar shape or a rectangular shape. The line 170 could be one of a common connecting line, a gate pad, a data pad, a line of a static electricity protecting circuit, a MPS line and a dummy line. The line 170 has a relatively greater width. For example, the line 170 has a width greater than about 200 micrometers. The plurality of first grooves 172 are arranged in a first row to be spaced apart from each other. The plurality of second grooves 174 are arranged in a second row to be spaced apart from each other. After the line 170 is fabricated though a lifting off process, a passivation pattern or a PR pattern at a central portion of the line 170 is perfectly removed. However, passivation patterns 152 and 156 (or PR patterns) remains at a portion which is far away from a portion between the first and second grooves 172 and 174. It is explained in more detail with reference to accompanied FIGS. 5A to 5C.

Referring to FIG. 5A, a first material layer 175 is formed on a substrate 100. Then, a PR layer 180 is formed on the first material layer 175. Considering other conditions, a gate insulating layer (not shown) may be formed between the substrate 100 and the first material layer 175 by depositing an inorganic insulating material including one of silicon oxide and silicon nitride. The first material layer 175 may be at least one of a first layer of a transparent conductive material and a second layer of a conductive metallic material. The first layer of the transparent conductive material could be indium-tin-oxide (ITO) or indium-zinc-oxide (IZO). The second layer of the conductive metallic material could be copper (Cu), Molybdenum (Mo), Molybdenum-titanium ally (Mo—Ti), aluminum (Al), Al alloy or chromium (Cr). FIG. 5A shows the first material layer 175 including the PR layer 180 formed thereon.

Next, a mask 190 having a transmissive area TA and a blocking area BA is disposed over the PR layer 180. The transmissive area TA and the blocking area BA are alternately arranged with each other. Considering other conditions, a half-tone mask having not only the transmissive area TA and the blocking area BA but also a half-transmissive area may be used.

Next, referring to FIG. 5B, the PR layer 180 (of FIG. 5A) are exposed through the mask 190 (of FIG. 5A) and developed. As a result, the PR layer 180 (of FIG. 5A) corresponding to the transmissive area TA (of FIG. 5A) is perfectly removed such that a portion of the first material layer 175 (of FIG. 5A) is exposed. The PR layer 180 (of FIG. 5A) corresponding to the blocking area BA (of FIG. 5A) remains on the first material layer 175 (of FIG. 5A) to form first to third PR patterns 182, 184 and 186.

Then, the exposed first material layer 175 (of FIG. 5A) is patterned by using the first to third PR patterns 182, 184 and 186 to form first to third line patterns 170a, 170b and 170c from the first material layer 175 (of FIG. 5A). Moreover, a first portion between the first and second line patterns 170a and 170b is defined as the first groove 172, and a second portion between the second and third line patterns 170b and 170c is defined as the second groove 174. End portions of the first to third line patterns 170a, 170b and 170c are connected to each other to form the line 170. In this case, the first material layer 175 (of FIG. 5A) is over-etched such that the first to third PR patterns 182, 184 and 186 has a greater width than the first to third line patterns 170a, 170b and 170c, respectively. This may be referred to as an undercut structure.

Referring again to FIG. 4, the first and second grooves 172 and 174 correspond to a portion where the line is removed within a width W of the line 170 so as to improve a lifting off process properties. Considering an electrical properties of the line 170, the first and second grooves patterns 172 and 174 are spaced apart from each other. The first and second grooves 172 and 174 are arranged to be parallel to each other in the first and second rows, respectively. Moreover, one groove has the same distance with adjacent groove. Due to the first and second grooves 172 and 174, a stripper used for the lifting off process is easily penetrated into the first and second grooves 172 and 174.

Next, a second material layer 150 is formed on the substrate 100 including the first to third PR patterns 182, 184 and 186. The second material layer 150 is formed of at least one of a transparent conductive material, a conductive metallic material and a passivation layer. The transparent conductive material could be ITO or IZO. The conductive metallic material could be copper (Cu), Molybdenum (Mo), Molybdenum-titanium ally (Mo—Ti), aluminum (Al), Al alloy or chromium (Cr). The passivation layer could be an organic insulating material or an inorganic insulating material. For example, the passivation layer is made of silicon oxide or silicon nitride. The second material layer 150 is deposited by a sputtering method.

As mentioned above, since the first to third PR patterns 182, 184 and 186 has a width greater than the first to third line patterns 170a, 170b and 170c, respectively, edge portions of the first to third PR patterns 182, 184 and 186 at a boundary between each of the first to third PR patterns 182, 184 and 186 and each of the first to third line patterns 170a, 170b and 170c are exposed. As a result, there are discontinuations in the second material layer 150 at the boundary between each of the first to third PR patterns 182, 184 and 186 and each of the first to third line patterns 170a, 170b and 170c.

Next, as shown in FIG. 5C, the stripper is penetrated through the discontinuation portions in the second material layer 150 into the first to third PR patterns 182, 184 (of FIG. 5B) and 186. Then, the first and third PR patterns 182, 186 (of FIG. 5B) and the second material layer 150 (of FIG. 5B) on the first and third PR patterns 182, 186 (of FIG. 5B) are removed at the same time. The second material layer 150 (of FIG. 5B) corresponding to the first and second grooves 172 and 174 remains to form first material patterns 158 between the first and second line patterns 170a and 170b and between the second and third line patterns 170b and 170c.

By the lifting off process, the second PR pattern 184 (of FIG. 5B) on the second line pattern 170b and the second material layer 150 (of FIG. 5B) on the second PR pattern 184 (of FIG. 5B) are perfectly removed. However, the first and third PR patterns 182 and 186, which are disposed on the first and third line patterns 170a and 170c, respectively, and passivation patterns 152 and 156 on the first and third PR patterns 182 and 186, respectively, partially remain. Though the above lifting off process is much powerful than the related art lifting off process, the above lifting off process still has some problems. It may be resulted from an arranging structure of the grooves.

Figure 6:
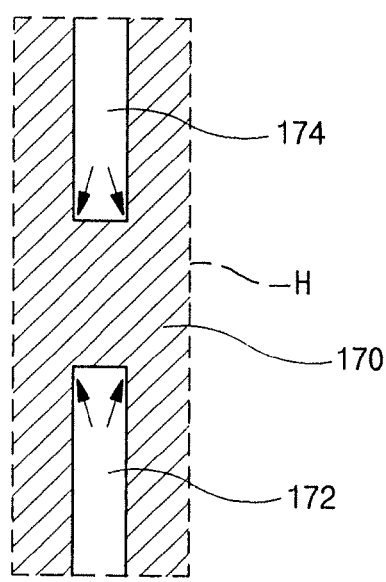
FIG. 6 is an enlarged plan view showing a "H" portion in FIG. 4.

FIG. 6 is an enlarged plan view showing an "H" portion in FIG. 4. Referring to FIG. 6, in the lifting off process, the stripper is penetrated through edge portions of the first and second grooves 172 and 174 along an arrow direction. (The arrows toward a corner of the first and second grooves in FIG. 6, while the stripper is penetrated through all edges of them.) Accordingly, the first and third PR patterns 182 and 186 (of FIG. 5C), which are relatively far away from the edges of the first and second PR patterns 172 and 174, partially remain. It causes some problems in followed processes and the LCD device. Particularly, the remaining PR patterns cause damages on rubbing clothes used for rubbing an alignment layer such that a line defect may be generated. Moreover, the remaining PR patterns and liquid crystal molecules produce a chemical reaction such that after image defects may be generated.

Figure 7:
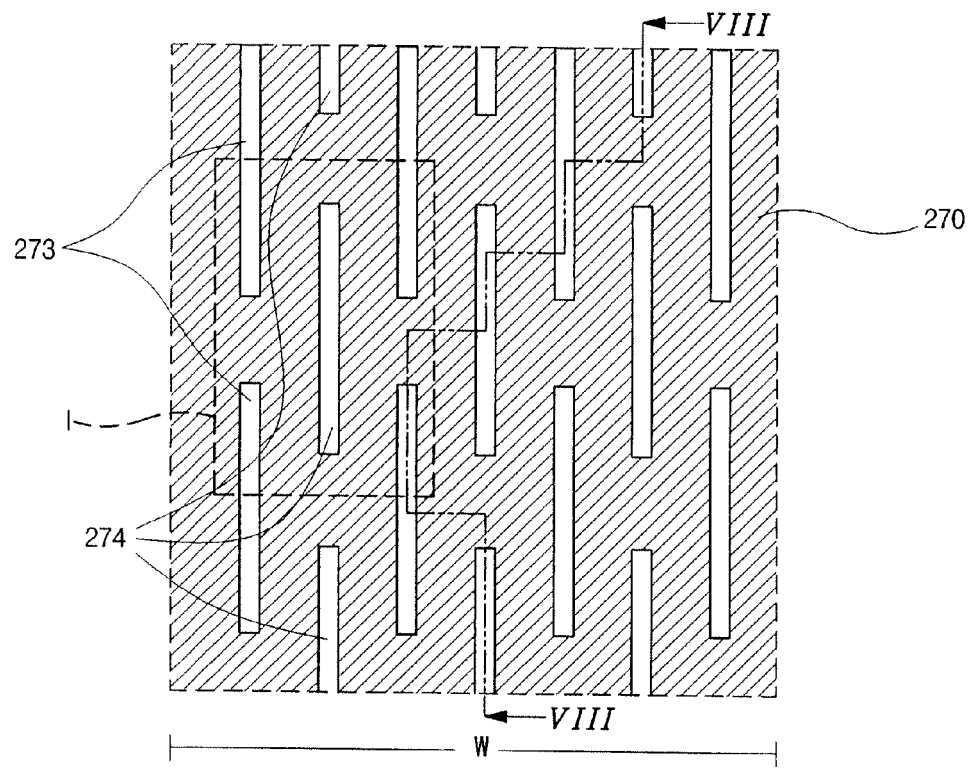
FIG. 7 is a plan view showing a portion of a line including a groove according to the present invention.
Figure 8A:
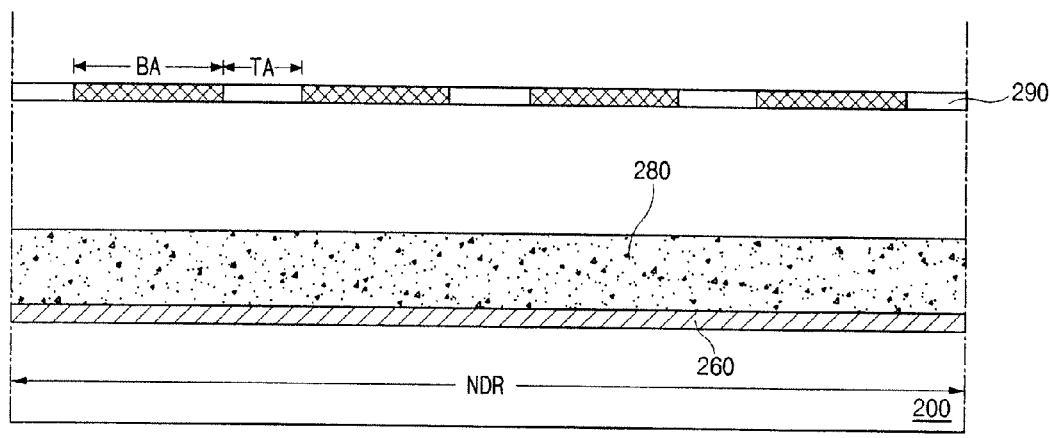
FIGS. 8A to 8D are cross-sectional views showing a fabricating process of a portion taken along the line VIII-VIII in FIG. 7.
Figure 8B:
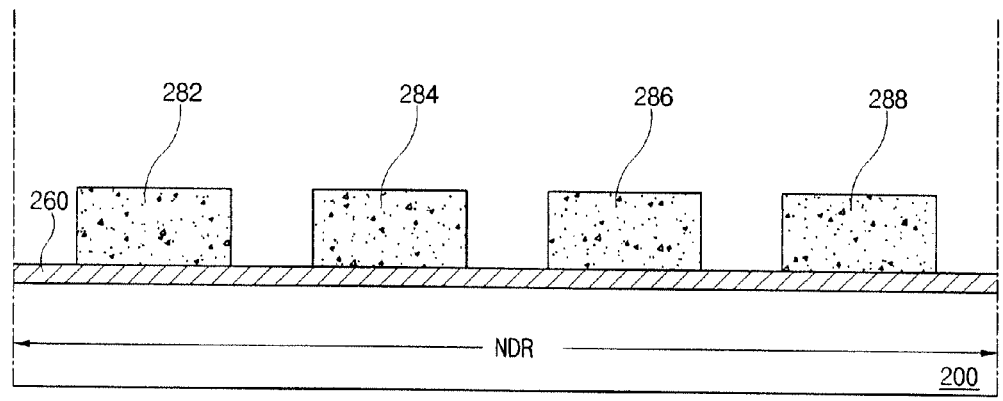
Figure 8C:
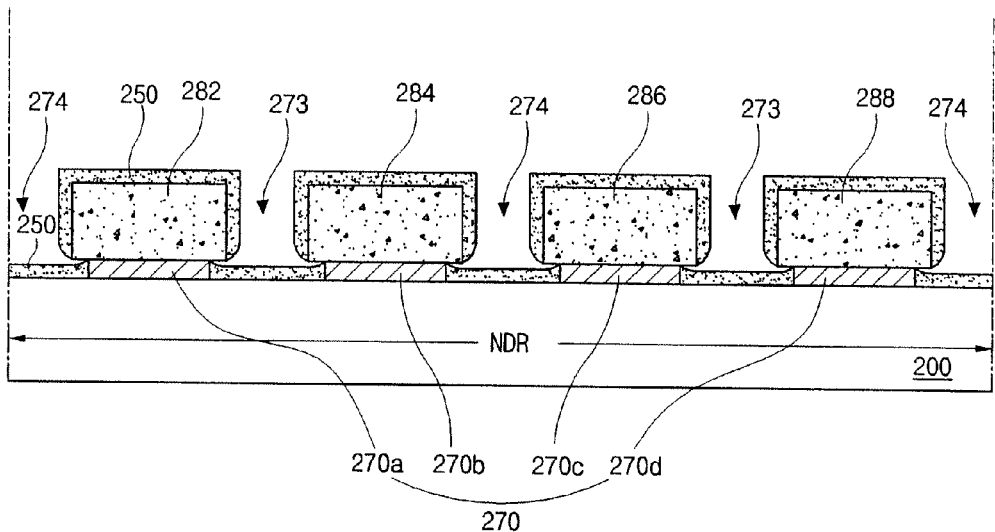

The following embodiments are introduced to resolve these problems. FIG. 7 is a plan view showing a portion of a line including a groove according to the present invention, and FIGS. 8A to 8C are cross-sectional views showing a fabricating process of a portion taken along the line VIII-VIII in FIG. 7.

As shown in FIG. 7, a plurality of first grooves 273 and a plurality of second grooves 274 are formed on a line 270. The plurality of first grooves 273 are arranged in (2N−1)th columns to be spaced apart from each other, and the plurality of second grooves 274 are arranged in (2N)th columns to be spaced apart from each other. (N is the positive integer.) Each of the second grooves 274 corresponds to a facing portion of two adjacent of the first grooves 273, and each of the first grooves 273 corresponds to a facing portion of two adjacent of the second grooves 274. The line 270 has a width greater than about 200 micrometers. Due to the first and second grooves 273 and 274 in FIG. 7, every positions of the line 270 has a relative low deviation in a distance from the first and second grooves 273 and 274. Accordingly, the problems, which are resulted from the PR patterns remaining after the lifting off process, are prevented.

The line 270 shown in FIG. 7 is fabricated by following processes. Referring to FIG. 8A, a first material layer 260 is formed on a substrate 200. Then, a PR layer 280 is formed on the first material layer 260 by coating photoresist. Considering other conditions, a gate insulating layer (not shown) may be formed between the substrate 200 and the first material layer 260 by depositing an inorganic insulating material including one of silicon oxide and silicon nitride. The first material layer 260 could be at least one of a first layer of a transparent conductive material and a second layer of a conductive metallic material. The first layer of the transparent conductive material could be indium-tin-oxide (ITO) or indium-zinc-oxide (IZO). The second layer of the conductive metallic material could be copper (Cu), Molybdenum (Mo), Molybdenum-titanium ally (Mo—Ti), aluminum (Al), Al alloy or chromium (Cr). FIG. 8A shows the first material layer 260 including the PR layer 280 formed thereon.

Next, a mask 290 having a transmissive area TA and a blocking area BA is disposed over the PR layer 280. The transmissive area TA and the blocking area BA are alternately arranged with each other. Considering other conditions, a half-tone mask having not only the transmissive area TA and the blocking area BA but also a half-transmissive area may be used.

Next, referring to FIG. 8B, the PR layer 280 (of FIG. 5b) are exposed through the mask 290 (of FIG. 8A) and developed. As a result, the PR layer 280 (of FIG. 8A) corresponding to the transmissive area TA (of FIG. 8A) is perfectly removed such that a portion of the first material layer 260 (of FIG. 8A) is exposed shown in FIG. 8B. The PR layer 280 (of FIG. 8A) corresponding to the blocking area BA (of FIG. 8A) remains on the first material layer 260 (of FIG. 8A) to form first to fourth PR patterns 282, 284, 286 and 288 shown in FIG. 8B.

Next, referring to FIG. 8C, the exposed first material layer 260 (of FIG. 8B) is patterned by using the first to fourth PR patterns 282, 284, 286 and 288 to form the line 270 where the first and second grooves 273 and 274 are formed. First to fourth line patterns 270a, 270b, 270c and 270d corresponding to the first to fourth PR patterns 282, 284, 286 and 288, respectively, are spaced apart from each other. Ends of the first to fourth line patterns 270a, 270b, 270c and 270d are connected to each other to form the line 270. Spaces between the first to fourth line patterns 270a, 270b, 270c and 270d are defined as the first and second grooves 273 and 274.

The first and second grooves 273 and 274 correspond to a portion where the line 270 is removed within a width W of the line 270 so as to improve a lifting off process properties. The first and second grooves 273 and 274 may have an arrangement in FIG. 7.

In more detail, each of the first and second grooves 273 and 274 has a bar shape. The first groove 273 is arranged in (2N−1)th columns to be spaced apart from each other, and the second groove 274 is arranged in (2N)th columns to be spaced apart from each other. (N is the positive integer.) Each of the second grooves 274 corresponds to a facing portion of two adjacent of the first grooves 273, and each of the first grooves 273 corresponds to a facing portion of two adjacent of the second grooves 274. Every positions of the line 270 has a relative low deviation in a distance from the first and second grooves 273 and 274. Accordingly, the stripper used for the lifting off process is easily penetrated into the PR patterns on an entire region of the line 270. Considering an area of the line 270 and a distortion of electrical properties, the first and second grooves 273 and 274 are disposed.

In this case, the first material layer 260 (of FIG. 8B) is patterned by isotropic wet-etching. The first material layer 260 (of FIG. 8A) under the first to fourth PR patterns 282, 284, 286 and 288 is over-etched such that the first to fourth PR patterns 282, 284, 286 and 288 has a greater width than the first to fourth line patterns 270a, 270b, 270c and 270d, respectively. Namely, edge portions of the first to fourth PR patterns 282, 284, 286 and 288 at a boundary between each of the first to fourth PR patterns 282, 284, 286 and 288 and each of the first to fourth line patterns 270a, 270b, 270c and 270d are exposed. During the lifting off process, the stripper is penetrated through the exposed edge portions of the first to fourth PR patterns 282, 284, 286 and 288.

Next, a second material layer 250 is formed on the substrate 200 including the first to fourth PR patterns 282, 284, 286 and 288. The second material layer 250 is formed of at least one of a transparent conductive material, a conductive metallic material and a passivation layer. The transparent conductive material including ITO or IZO. The conductive metallic material could be copper (Cu), Molybdenum (Mo), Molybdenum-titanium ally (Mo—Ti), aluminum (Al), Al alloy or chromium (Cr). The passivation layer could be an organic insulating material or an inorganic insulating material. For example, the passivation layer is made of silicon oxide or silicon nitride. The second material layer 250 is deposited by a sputtering method. Particularly, the passivation layer is deposited by the sputtering method, but not a plasma chemical vapor deposition method.

Generally, the passivation layer of the LCD device is formed by depositing an inorganic insulating material through the plasma chemical vapor deposition method. However, because the plasma chemical vapor deposition method requires a relatively high temperature, for example, greater than about 350 degrees Celsius, there are some damages on the first to fourth PR patterns 282, 284, 286 and 288. It is because a material of the first to fourth PR patterns 282, 284, 286 and 288 has heat-resisting properties against about 150 degrees Celsius. When the passivation layer is deposited by the plasma chemical vapor deposition method, the first to fourth PR patterns 282, 284, 286 and 288 collapse and are perfectly covered with the passivation layer. In this case, since the stripper can not be penetrated into the first to fourth PR patterns 282, 284, 286 and 288, there are serious problems in the lifting off process. Moreover, the remaining PR patterns and liquid crystal molecules produce a chemical reaction such that problems such as after image defects may be generated. To resolve these problems, the passivation layer is deposited by a sputtering method having a process temperature less than about 150 degrees Celsius.

When the second material layer 250 is deposited by the sputtering method having a process temperature smaller than a heat-resisting temperature of the first to fourth PR patterns 282, 284, 286 and 288, there are no damages on the first to fourth PR patterns 282, 284, 286 and 288. Moreover, it is possible for the second material layer 250 to be deposited onto a flexible substrate, for example, a plastic substrate.

Figure 8D:
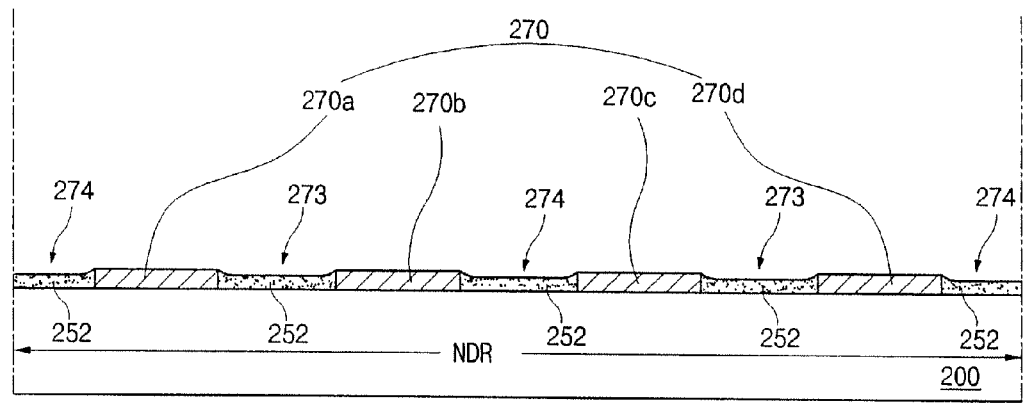

Next, referring to FIG. 8D, a lifting off process is performed onto the substrate 200 including the second material layer 250 (of FIG. 8C) and the first to fourth PR patterns 282, 284, 286 and 288 (of FIG. 8C) by using a stripper. As a result, the first to fourth PR patterns 282, 284, 286 and 288 (of FIG. 8C) and the second material layer 250 (of FIG. 8C) on the first to fourth PR patterns 282, 284, 286 and 288 (of FIG. 8C) are removed at the same time. The second material layer 250 (of FIG. 8C) corresponding to the first and second grooves 273 and 274 remain to form a material pattern 252.

In this embodiment of the present invention, the plurality of first grooves 273 and the plurality of second grooves 274 may be arranged as shown in FIG. 7. Namely, each of the second grooves 274 corresponds to a space between two adjacent first grooves 273. Accordingly, the stripper is easily penetrated into entire regions of the PR patterns 282, 284, 286 and 288 (of FIG. 8C). Namely, due to the first and second grooves 273 and 274, which may be arranged as shown in FIG. 7, there are improved properties in the lifting off process. Moreover, since the material layer on the PR patterns is formed by the sputtering method, there is no damage in the lifting off process.

Figure 9:
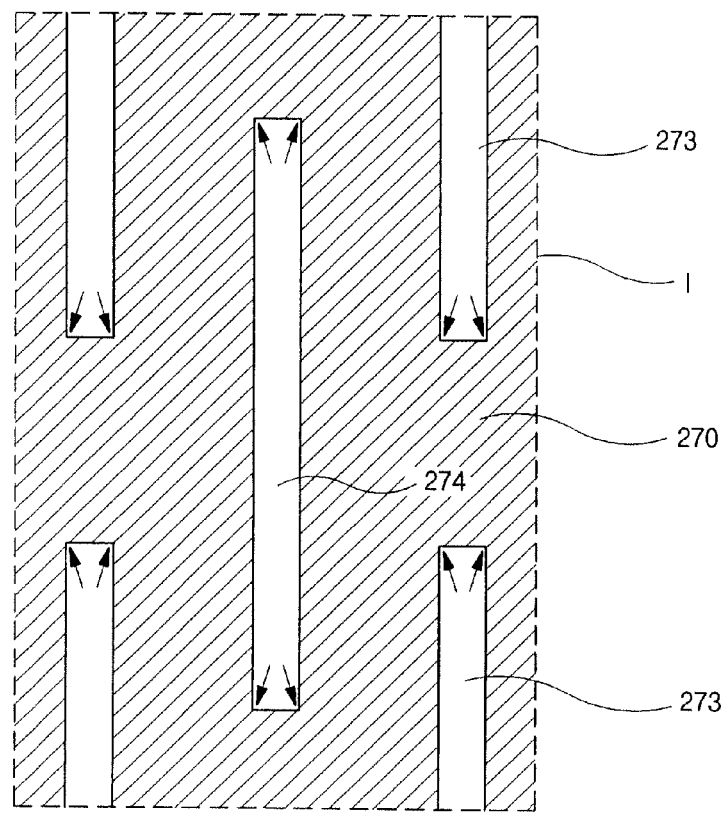
FIG. 9 is an enlarged plan view showing a "I" portion in FIG. 7.

FIG. 9 is an enlarged plan view showing a "I" portion in FIG. 7. Referring to FIG. 9, in the lifting off process, the stripper is penetrated through edge portions of the first and second grooves 273 and 274 along an arrow direction. (The arrows toward a corner of the first and second grooves in FIG. 9, while the stripper is penetrated through all edges of them.) Since the first and second grooves 273 and 274 are alternately arranged, the first to fourth PR patterns 282, 284, 286 and 288 at every region of the line 270 and the second materially layer 250 (of FIG. 8C) are easily removed by the lifting off process.

FIGS. 4 to 9 show the first and second grooves having a bar shape. However, they can have various shapes. FIGS. 10A to 10F are plan views showing a groove according to the present invention, respectively. As mentioned above, the line 370 in FIGS. 10A to 10F is one of signal lines and metal patterns having a width greater than about 200 micrometers.

Figure 10A:
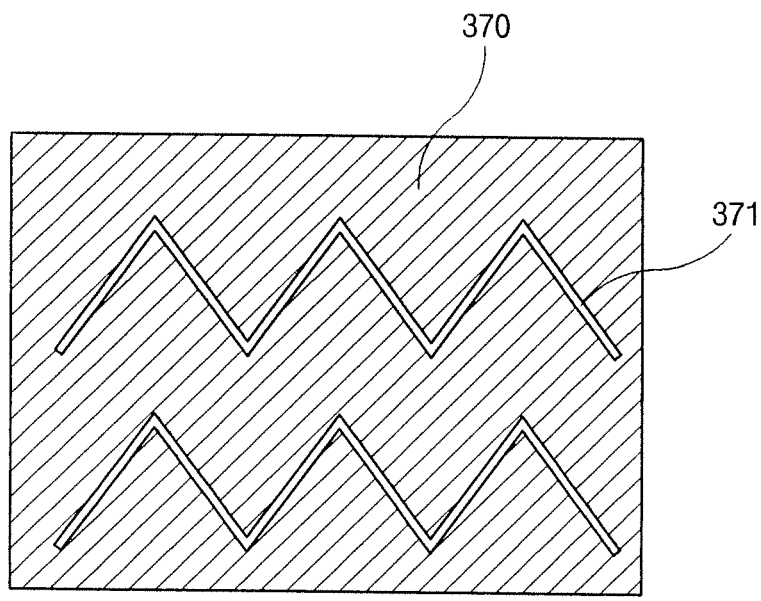
FIGS. 10A to 10F are plan views showing a groove according to the present invention, respectively.
Figure 10B:
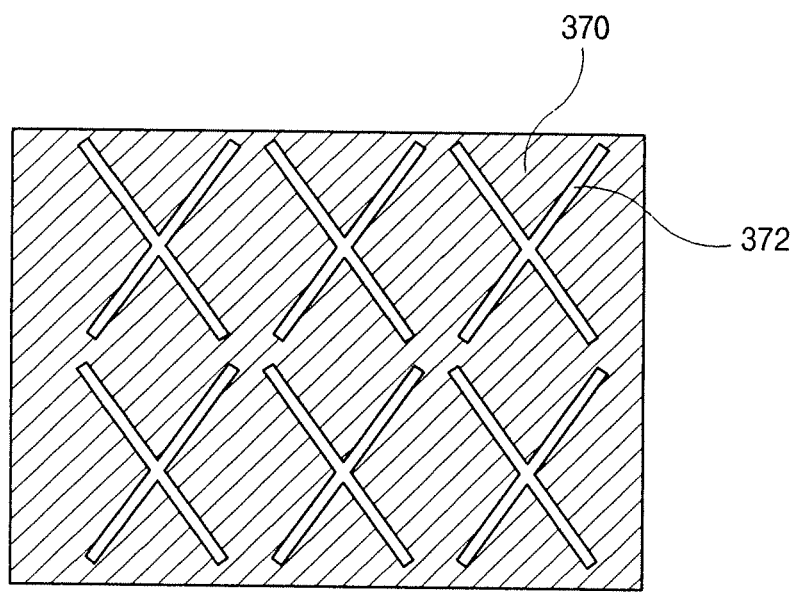
Figure 10C:
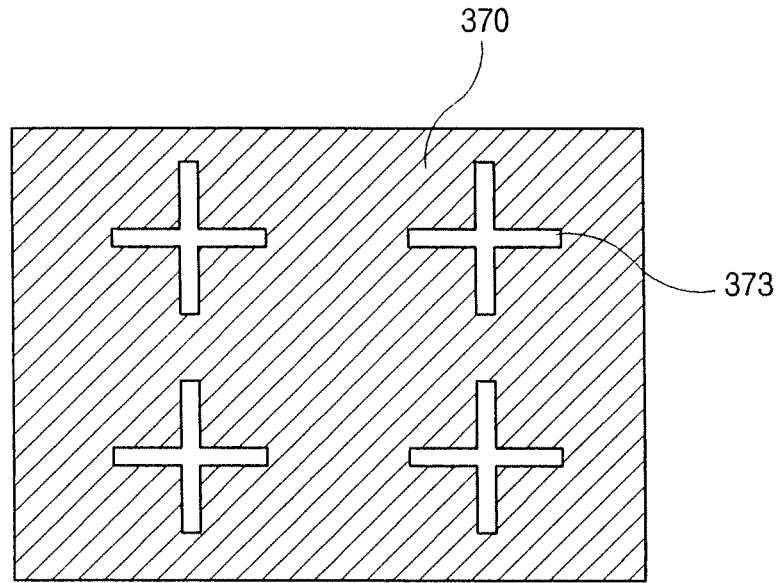
Figure 10D:
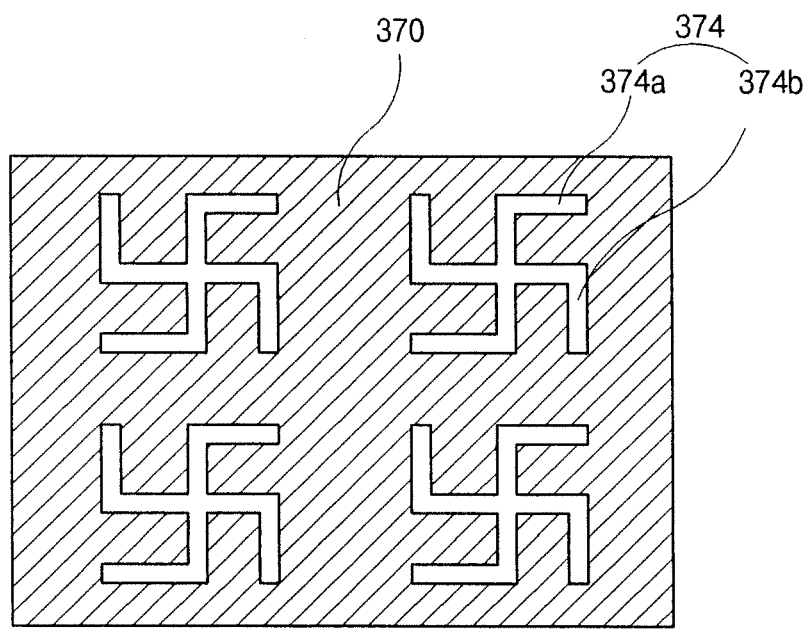
Figure 10E:
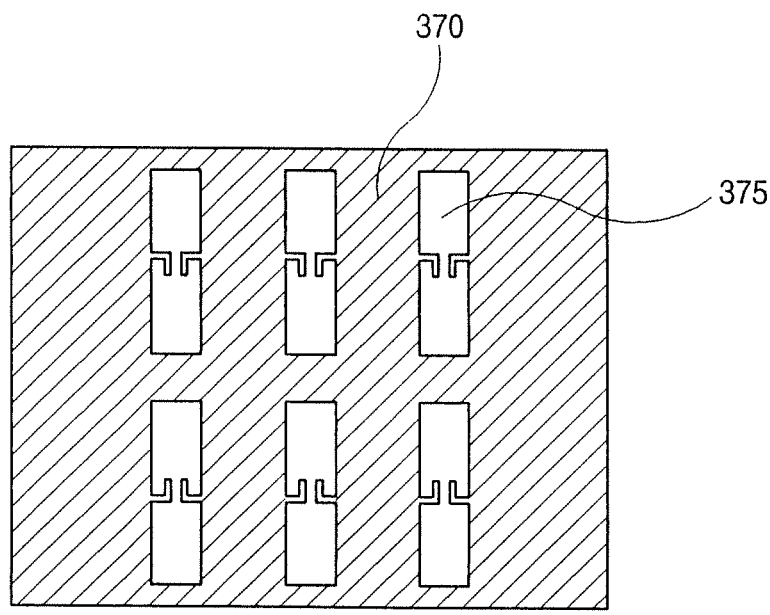
Figure 10F:
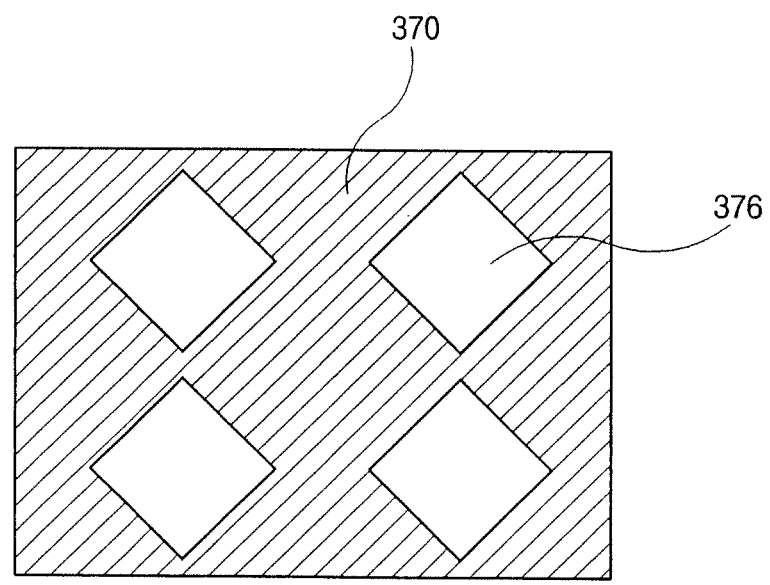

Referring to FIG. 10A, at least one groove 371 of an island is disposed on the line 370. The groove 371 has a saw tooth shape. Referring to FIG. 10B, the groove 372 has two-crossing lines. The two-crossing lines are oblique to each other. Namely, the groove 372 has an obtuse angle or an acute angle at a crossing portion of the two lines. Referring to FIG. 10C, the groove 373 has a cross shape. The lines of the groove 373 cross each other to be perpendicular to each other. Referring to FIG. 10D, the groove 374 including first and second groove lines 374a and 374b has a weathercock shape. Namely, the first and second groove lines 374a and 374b cross each other to be perpendicular to each other, and extending lines of the first and second groove lines 374a and 374b are spaced apart from and perpendicular to each other. Referring to FIG. 10E, the groove 375 has a wall having an opening in a bar shape pattern. Referring to FIG. 10F, the groove 376 has a diamond-shape. In other embodiments, the groove may have one of a triangle shape, a square shape and so on. The grooves are formed on the line having a relatively great width to improve properties in a lifting off process. The grooves are disposed with an island shape such that the line maintains electrical properties. The line is one of the gate pad, the data pad, the MPS line, the static electricity protecting circuit line, and the dummy line.

Since the stripper used for a lifting off process is easily penetrated into a PR pattern by the grooves, there is no problem in the lifting off process. Moreover, since a material layer is deposited by a sputtering method having a relatively low process temperature onto the PR pattern, a damage on the PR pattern is prevented.

Hereinafter, a method of fabricating an array substrate for an LCD device using the above-mentioned lifting off process is explained.

Figure 11:
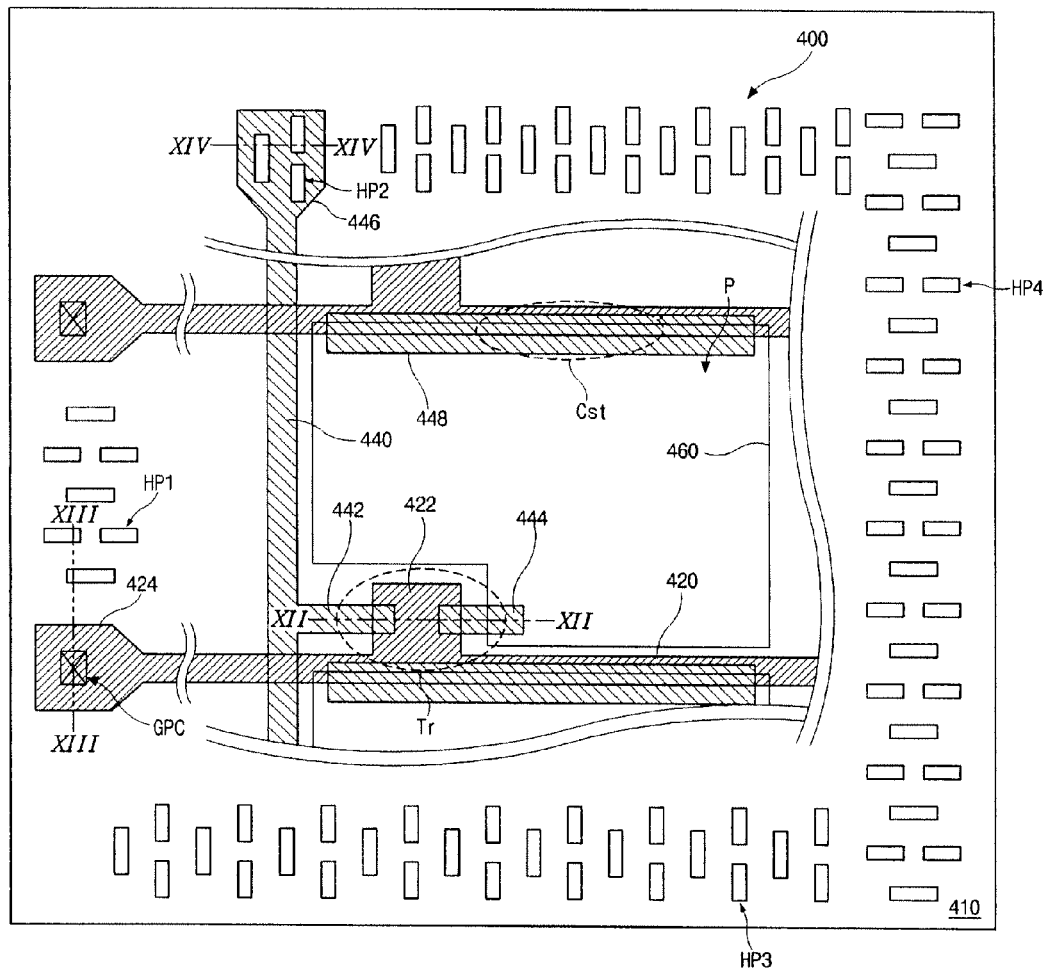
FIG. 11 is a schematic plan view showing an array substrate for a liquid crystal display device according to the present invention.

FIG. 11 is a schematic plan view showing an array substrate for a liquid crystal display device according to the present invention. FIGS. 12A to 12F are cross-sectional views showing a fabricating process of a portion taken along the line XII-XII in FIG. 11, FIGS. 13A to 13F are cross-sectional views showing a fabricating process of a portion taken along the line XIII-XIII in FIG. 11, and FIGS. 14A to 14F are cross-sectional views showing a fabricating process of a portion taken along the line XIV-XIV in FIG. 11.

Referring to FIG. 11, the substrate 410 of the liquid crystal display device includes a display region and a non-display region. The non-display region is disposed at periphery of the display region of the pixel region P. As shown in FIG. 11, the non-display region has a plurality of segments, and each of the segments has at least a groove. Alternatively, each of the segments has a plurality of the grooves, and the two adjacent grooves apart from each other. The segments mentioned above can be the gate pad, the data pad, the MPS line, the static electricity protecting circuit line, the dummy line, dummy area, gate line, or data line. In detail, a gate line 420 is formed on the substrate 410 of the array substrate 400. A data line 440 crosses the gate line 420 to define the pixel region P. A thin film transistor (TFT) Tr including a gate electrode 422, a semiconductor layer (not shown), a source electrode 442 and a drain electrode 444 is formed in the pixel region P. A pixel electrode 460 connected to the TFT Tr is also formed in the pixel region P. The gate electrode 422 and the source electrode 442 are connected to the gate and data lines 420 and 440, respectively, and the drain electrode 444 is spaced apart from the source electrode 442. The pixel electrode 460 overlaps a metal pattern 448, which overlaps the gate line 420, to form a storage capacitor Cst. The metal pattern 448 is electrically connected to one of the pixel electrode 460 and the gate line 420.

A gate pad 424 contacting a gate pad electrode (not shown) through a gate pad contact hole GPC is disposed at one end of the gate line 420, and a data pad 446 contacting a data pad electrode (not shown) is disposed at one end of the data line 440. The gate and data pads 424 and 446 are disposed in the non-display region at periphery of the display region of the pixel region P.

First to fourth grooves HP1, HP2, HP3 and HP4 are formed in the non-display region. The first groove HP1 is formed in a first non-display region where the gate pad 424 is formed, and the second groove HP2 is formed in a second non-display region where the gate pad 424 is formed. The third groove HP3 is formed in a third non-display region facing the second non-display region, and the fourth groove HP4 is formed in a fourth non-display region facing the first non-display region. Due to the first to fourth grooves HP1, HP2, HP3 and HP4, a portion of a material layer is easily removed in a lifting off process. During process of removing the portion of the material layer, the pixel electrode 460 is defined. The first to fourth grooves HP1, HP2, HP3 and HP4 have one of shapes in FIGS. 4, 7 and 10A to 10F.

The array substrate is fabricated through following processes. FIGS. 12A to 12F show a pixel region P including a switching region TrA where the TFT is formed, FIGS. 13A to 13F show a gate pad region GPA where the gate pad is formed, and FIGS. 14A to 14F show a data pad region DPA where the data pad is formed.

Figure 12A:
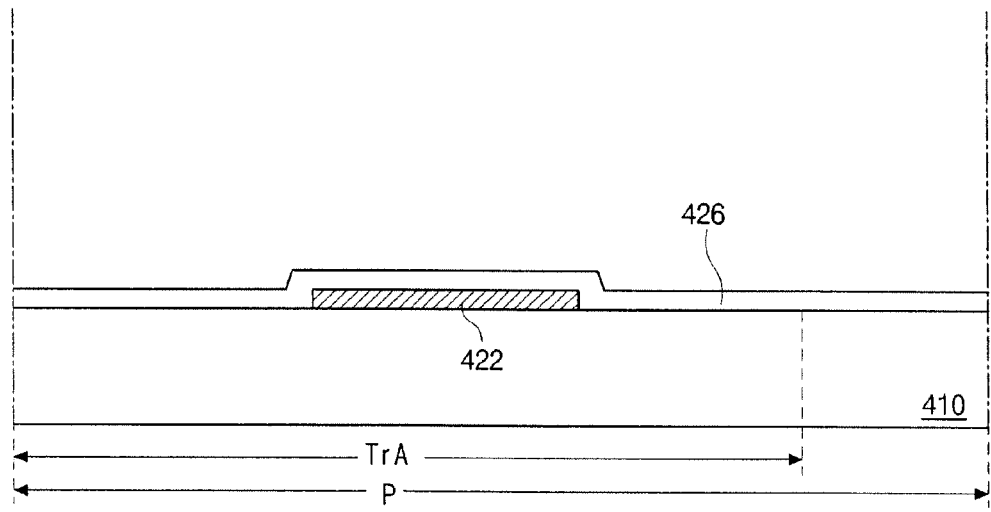
FIGS. 12A to 12F are cross-sectional views showing a fabricating process of a portion taken along the line XII-XII in FIG. 11.
Figure 13A:
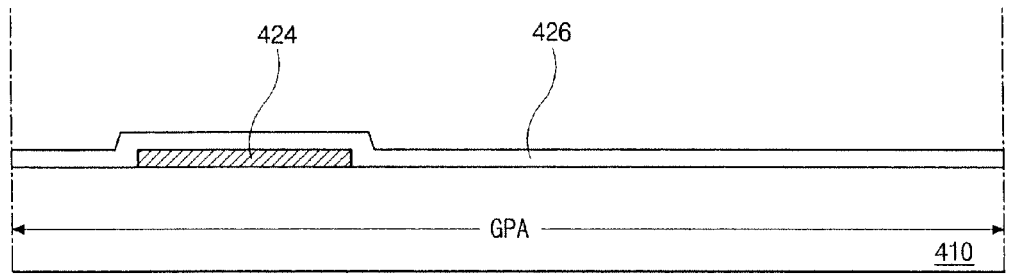
FIGS. 13A to 13F are cross-sectional views showing a fabricating process of a portion taken along the line XIII-XIII in FIG. 11.
Figure 14A:
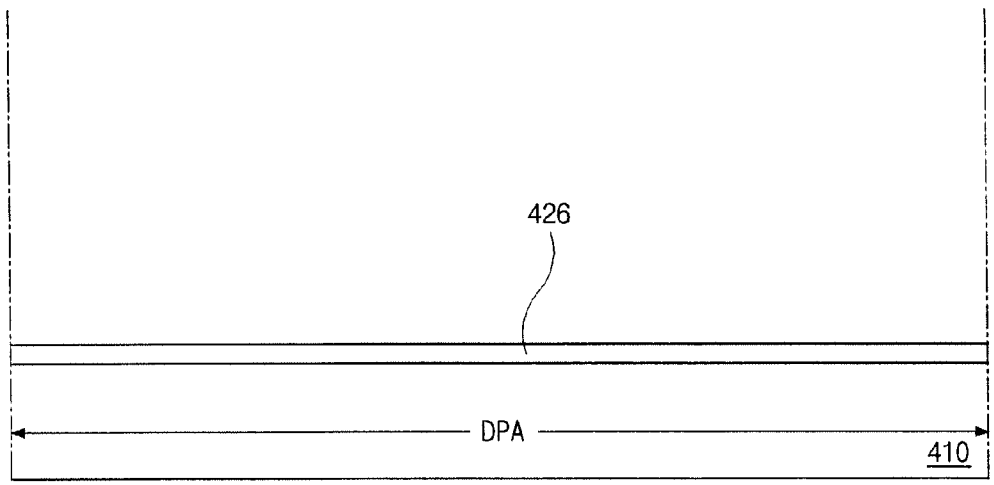
FIGS. 14A to 14F are cross-sectional views showing a fabricating process of a portion taken along the line XIV-XIV in FIG. 11.

Referring to FIGS. 12A, 13A and 14A showing a first mask process, a first metal layer (not shown) is formed on a substrate 410 by depositing at least one of copper (Cu), Molybdenum (Mo), Molybdenum-titanium ally (Mo—Ti), aluminum (Al), Al alloy or chromium (Cr). The first metal layer (not shown) is patterned to form a gate line (not shown), a gate electrode 422 extending from the gate line (not shown) into the switching region TrA and a gate pad 424 connected to the gate line (not shown) in the gate pad region GPA. Next, a gate insulating layer 426 of silicon oxide or silicon nitride is formed on an entire surface of the substrate including the gate line (not shown), the gate electrode 422 and the gate pad 424.

Figure 12B:
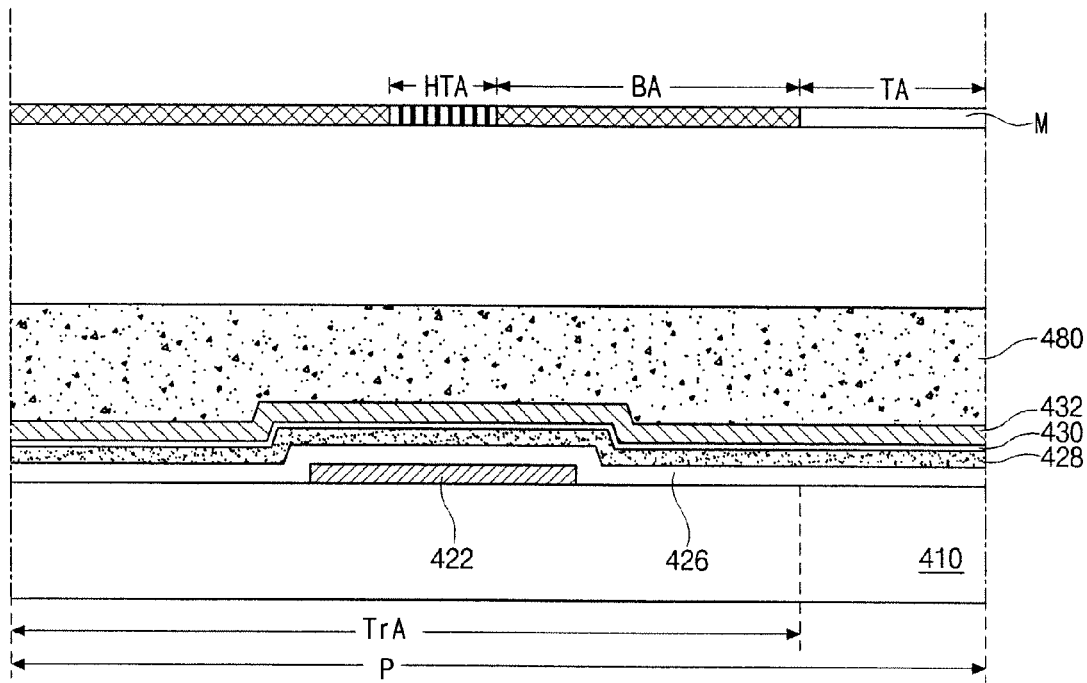
Figure 12C:
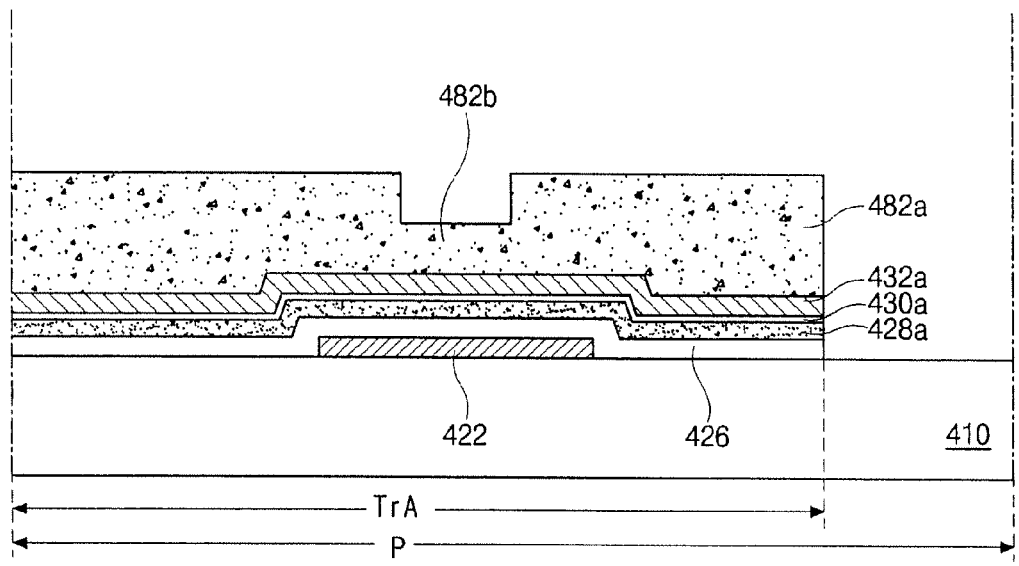
Figure 12D:
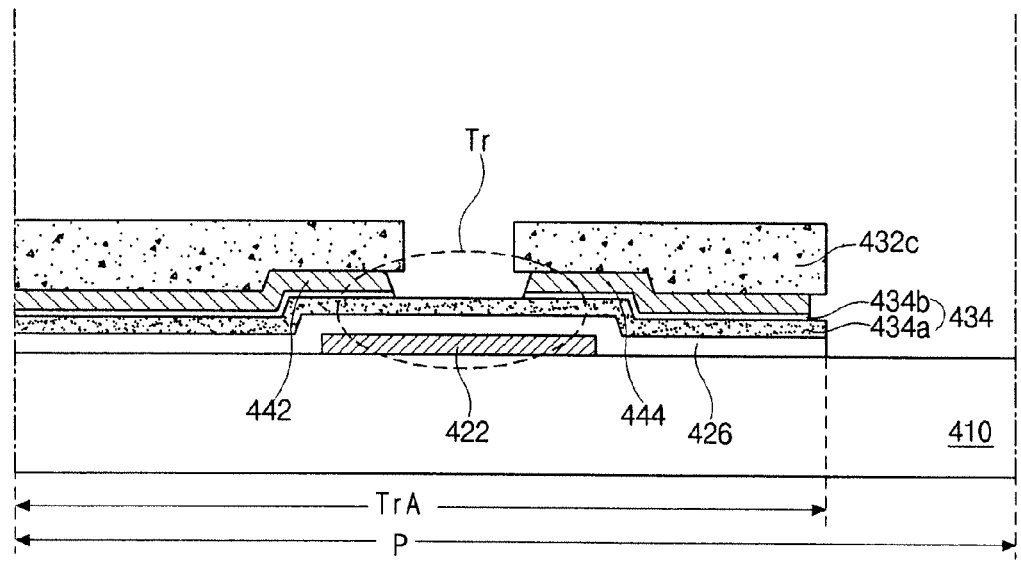
Figure 13B:
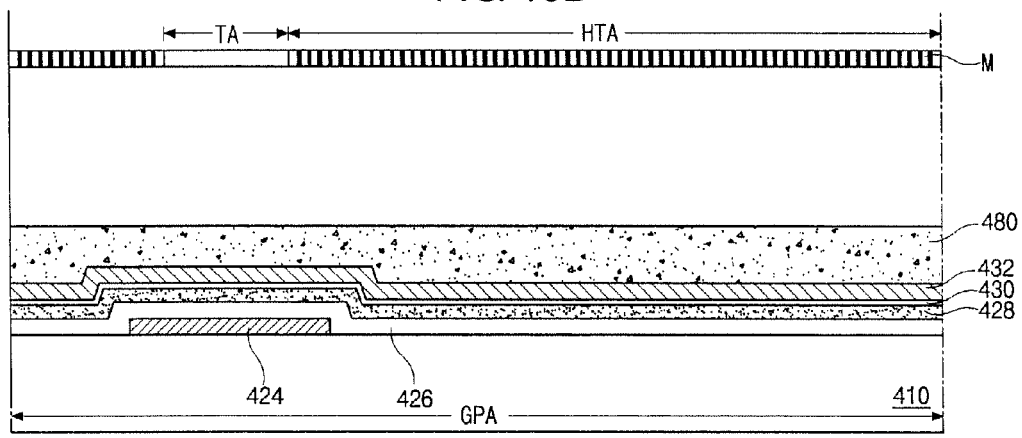
Figure 13C:
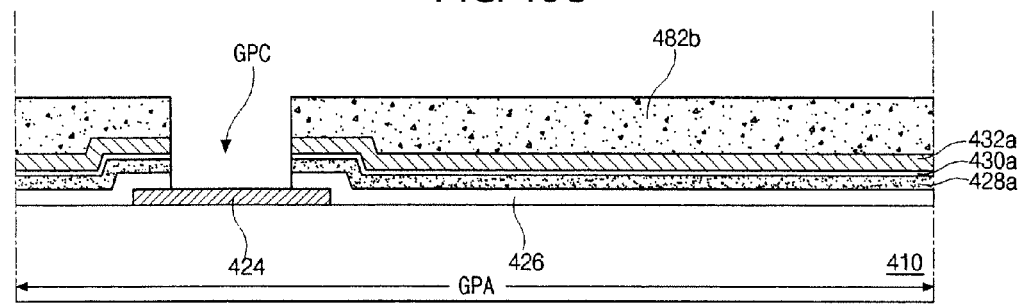
Figure 13D:
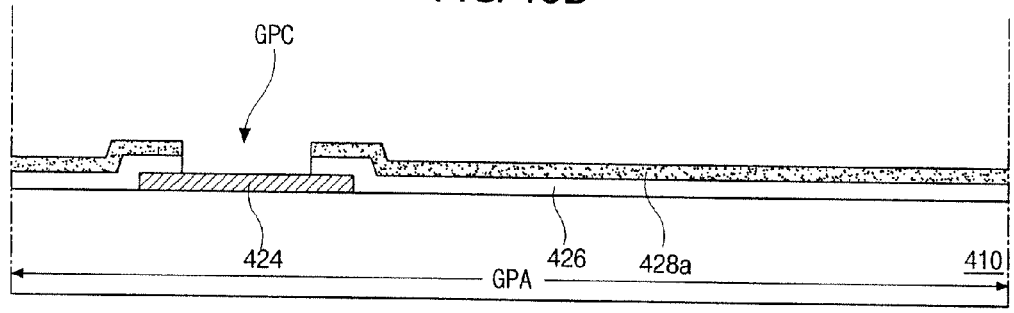
Figure 14B:
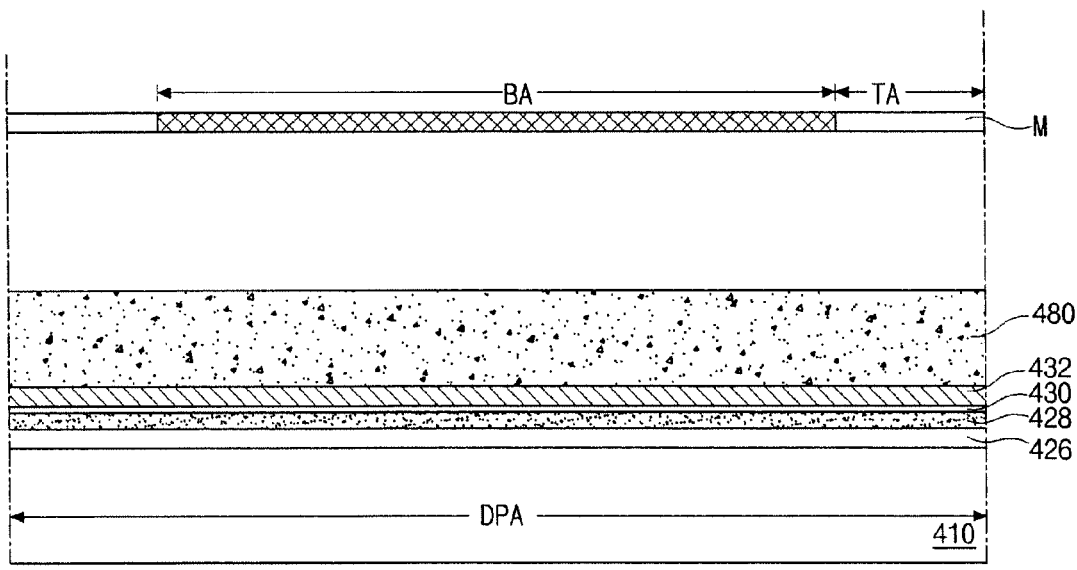

FIGS. 12B to 12D, 13B to 13D and 14B to 14D show a second mask process. Referring to FIGS. 12B, 13B and 14B, an intrinsic amorphous silicon layer 428, an impurity-doped amorphous silicon layer 430 and a second metal layer 432 are sequentially deposited on the gate insulating layer 426. The second metal layer 432 could be at least one of copper (Cu), Molybdenum (Mo), Molybdenum-titanium ally (Mo—Ti), aluminum (Al), Al alloy and chromium (Cr). A first PR layer 480 of photoresist is formed on the second metal layer 432, and then a mask M including a transmissive area TA, a half-transmissive area HTA and a blocking area BA is disposed over the first PR layer 480. The half-transmissive area HTA has a transmittance smaller than the transmissive area TA and greater than the blocking area BA. The half-transmissive area HTA corresponds to a center of the gate electrode 422 and both sides of the gate pad 424, and the blocking area BA corresponds to both sides of the gate electrode 422 and the data pad (not shown). The transmissive area TA corresponds to other portions. The first PR layer 480 is exposed through the mask M and then developed.

Figure 14C:
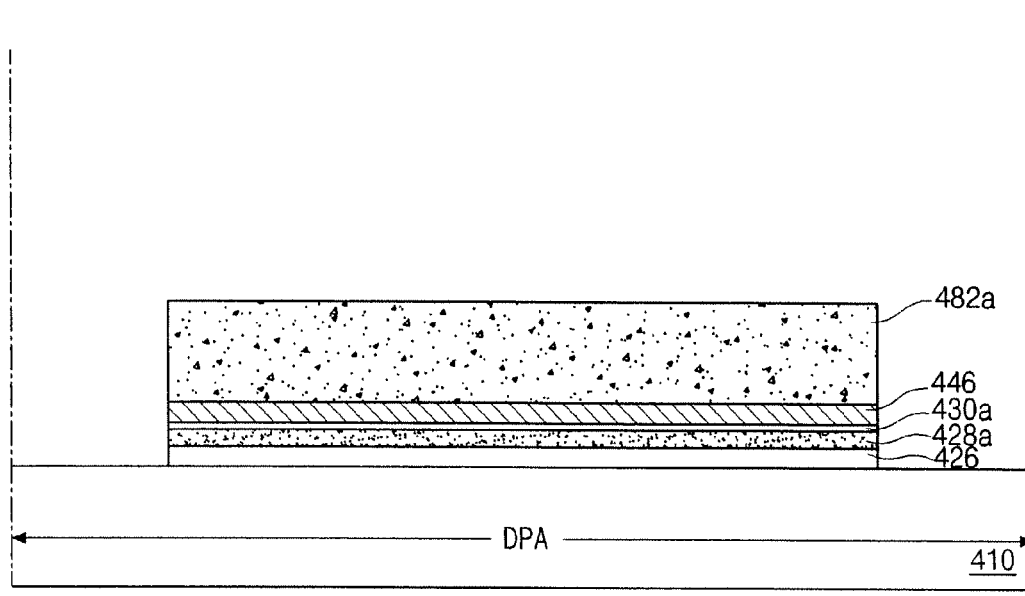

As a result, referring to FIGS. 12C, 13C and 14C, a first PR pattern 482a, which corresponds to the blocking area BA (of FIGS. 12B and 14B) and has a first height, and a second PR pattern 482b, which corresponds to the half-transmissive area HTA (of FIGS. 12B and 13B) and has a second height less than the first height, are formed on the second metal layer 432 (of FIGS. 12B, 13B and 14B). On the other hand, the first PR layer 480 (of FIG. 12B) corresponding to the transmissive area TA (of FIGS. 12B, 13B and 14B) is perfectly removed to expose a portion of the second metal layer 432 (of FIGS. 12B, 13B and 14B). Next, the exposed second metal layer 432 (of FIGS. 12B, 13B and 14B), and the impurity-doped amorphous silicon layer 430 (of FIGS. 12B, 13B and 14B), the intrinsic amorphous silicon layer 428 (of FIGS. 12B, 13B and 14B) and the gate insulating layer 426 (of FIGS. 12B, 13B and 14B) under the exposed second metal layer 432 (of FIGS. 12B, 13B and 14B) are sequentially patterned by using the first and second PR patterns 482a and 482b as a patterning mask. As a result, a portion of the substrate 410 corresponding to the pixel region P is exposed, and the gate pad 424 is exposed through a gate pad contact hole GPC. A data pad 446 is formed from the second metal layer 432 (of FIG. 14C) in the data pad region DPA. Moreover, a metallic material pattern 432a, an impurity-doped amorphous silicon pattern 430a and an intrinsic amorphous silicon pattern 428a are also formed.

Figure 14D:
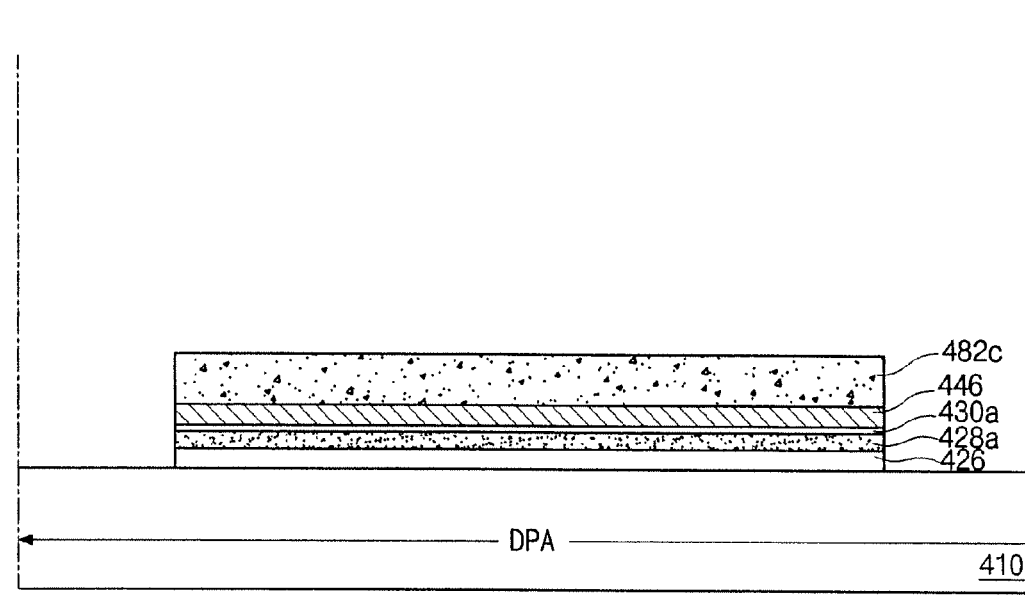

Next, referring to FIGS. 12D, 13D and 14D, an aching process is performed onto the first and second PR patterns 482a and 482b (of FIGS. 12C, 13C and 14C) to remove the second PR pattern 482b (of FIGS. 12C, 13C and 14C) and form a third PR pattern 482c from the first PR pattern 482a (of FIGS. 12C and 14C). The third PR pattern 482c has a height smaller than the first PR pattern 482a (of FIGS. 12C and 14C). The exposed metallic material pattern 432a (of FIGS. 12C and 13C) and the impurity-doped amorphous silicon pattern 430a (of FIGS. 12C and 13C) under the exposed metallic material pattern 432a (of FIGS. 12C and 13C) are removed to expose a portion of the intrinsic amorphous silicon pattern 428a (of FIGS. 12C and 13C). As a result, a source electrode 442 and a drain electrode 444 spaced apart from the source electrode 442 is formed from the metallic material pattern 432a (of FIG. 12C). An ohmic contact layer 434b is formed from the impurity-doped amorphous silicon pattern 430a (of FIG. 12C). And the intrinsic amorphous silicon pattern 428a (of FIG. 12C) exposed between the source and drain electrodes 442 and 444 is defined as an active layer 434a. The active layer 434a and the ohmic contact layer 434b constitute a semiconductor layer 434. The gate electrode 422, the gate insulating layer 426, the semiconductor layer 434 including the active layer 434a and the ohmic contact layer 434b, the source electrode 442 and the drain electrode 444 constitute the TFT Tr in the switching region TrA.

Figure 12E:
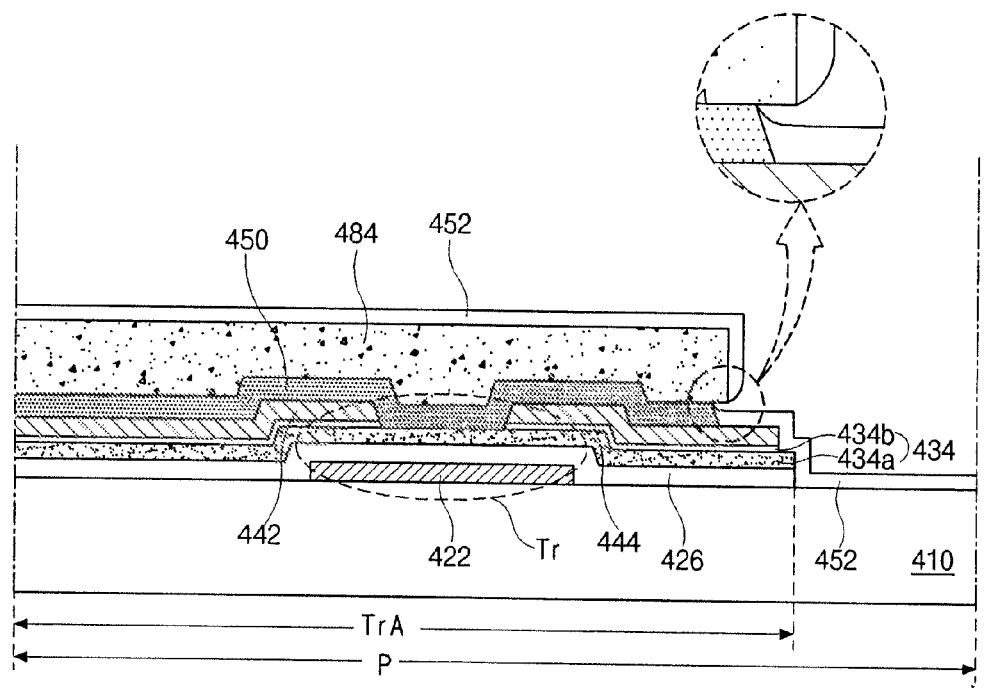
Figure 12F:
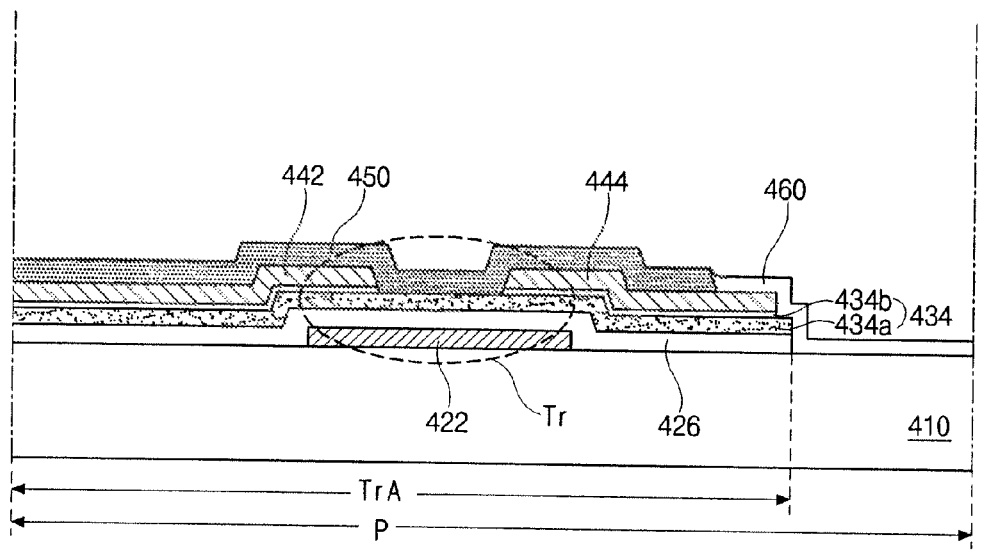
Figure 13E:
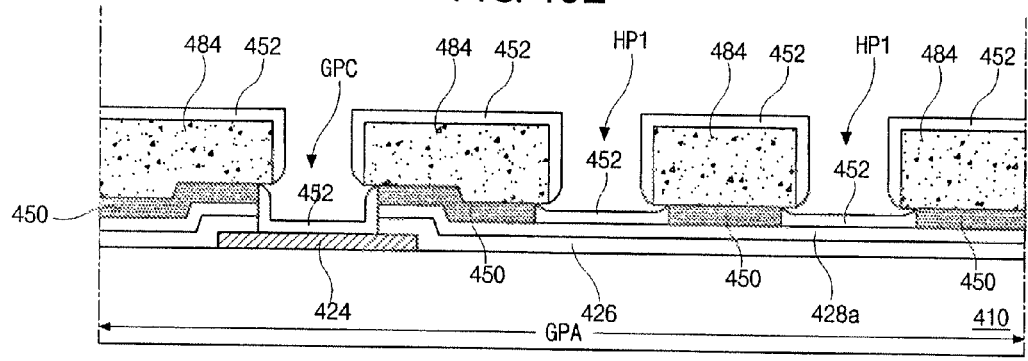
Figure 13F:
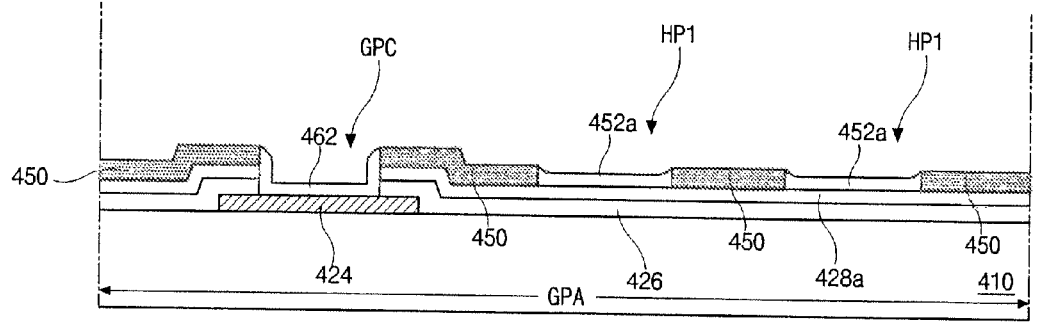
Figure 14E:
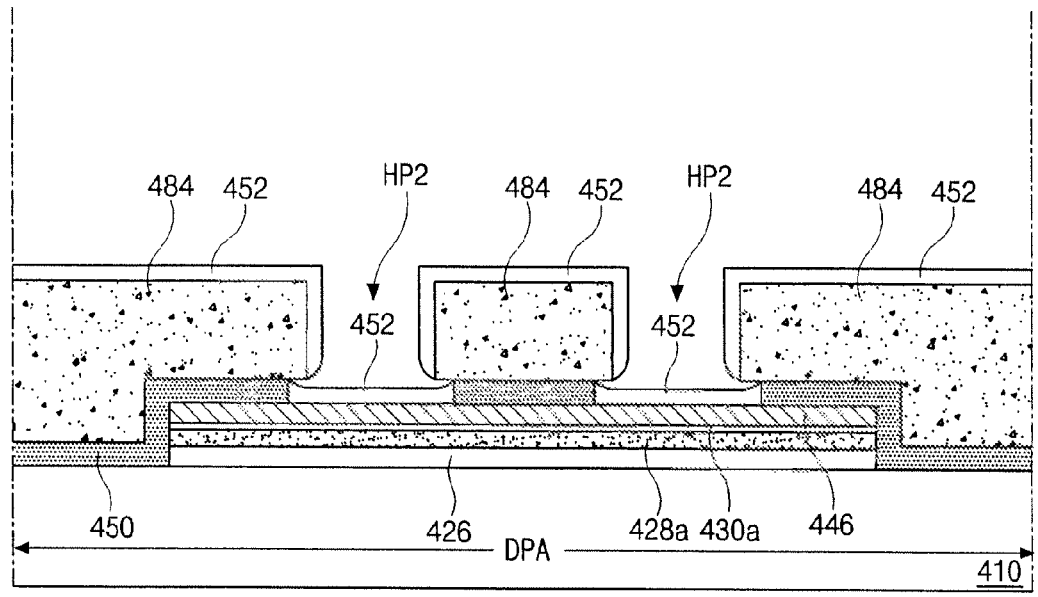

FIGS. 12E to 12F, 13E to 13F and 14E to 14F show a third mask process. Referring to FIGS. 12E, 13E and 14E, the third PR pattern 482c is removed, and then an insulating material layer (not shown) and a fourth PR pattern 484 on the insulating material layer (not shown) are formed. The fourth PR pattern 484 corresponds to the switching region TrA and boundaries of the gate pad 424. The fourth PR patterns 484 in the gate pad region GPA are spaced apart from each other in a cross-sectional view. The fourth PR pattern 484 in the switching region TrA exposed a portion of the drain electrode 444. A space between adjacent two fourth PR patterns 484 in the gate pad region GPA is defined as a first groove HP1. In addition, the fourth PR pattern 484 is also formed on the data pad 446. The fourth PR pattern 484 in the data pad 446 corresponds to a center and both sides of the data pad 446. Spaces between the fourth PR pattern 484 in the center and the fourth PR pattern 484 in each side are defined as a second groove HP2. In drawings, it looks like portions of the fourth PR pattern 484 being separated from each other. However, the first and second grooves HP1 and HP2 correspond to holes in the fourth PR pattern 484 such that the fourth PR pattern 484 in each region has an integrated body as a whole.

Although not shown, there are another fourth patterns in non-display regions facing the data pad region DPA and the gate pad region GPA such that third and fourth grooves are defined in the non-display regions, respectively.

Next, a passivation layer 450 is formed by patterning the insulating material layer (not shown) by using the fourth PR pattern 484 as a pattering mask. In this case, the insulating material layer (not shown) is over-etched such that end portions of the fourth PR pattern 484 protrude from the passivation layer 450. Namely, the fourth PR pattern 484 has a width greater than the passivation layer 450. It may be referred to as an undercut structure.

Next, a transparent conductive material layer 452 is formed on the fourth PR pattern 484 and the passivation layer 450 by depositing a transparent conductive material, for example, ITO or IZO. As mentioned above, since the end portions of the fourth PR pattern 484 protrude from the passivation layer 450, there is a discontinuation on the transparent conductive material layer 452 at boundary of the fourth PR pattern 484 and the passivation layer 450. When the transparent conductive material layer 452 is formed by a plasma chemical vapor deposition method having a process temperature above 350 degrees Celsius, there are damages on the fourth PR pattern 484 such that defects in the lifting off process are generated. Accordingly, the transparent conductive material layer 452 is formed by a sputtering method having a process temperature less than about 150 degrees Celsius.

Next, a lifting off process is performed using a stripper. The stripper penetrates through the discontinuation on the transparent conductive material layer 452 into the fourth PR pattern 484 such that the fourth PR pattern 484 and the transparent conductive material layer 452 on the fourth PR pattern 484 can be removed. In this case, the first and second grooves HP1 and HP2 and the third and fourth grooves (not shown), activates the lifting off process. In more detail, the fourth PR pattern 484 in the non-display region has a width greater than about 200 micrometers. Accordingly, if the fourth PR pattern 484 and the transparent conductive material layer 452 on the fourth PR pattern 484 are removed by the related art lifting off process, the fourth PR pattern 484 and the transparent conductive material layer 452 on the fourth PR pattern 484 are not perfectly removed. However, due to the first and second grooves HP1 and HP2 and the third and fourth grooves (not shown) in the present invention, the problems in the related art lifting off process can be overcome.

Figure 14F:
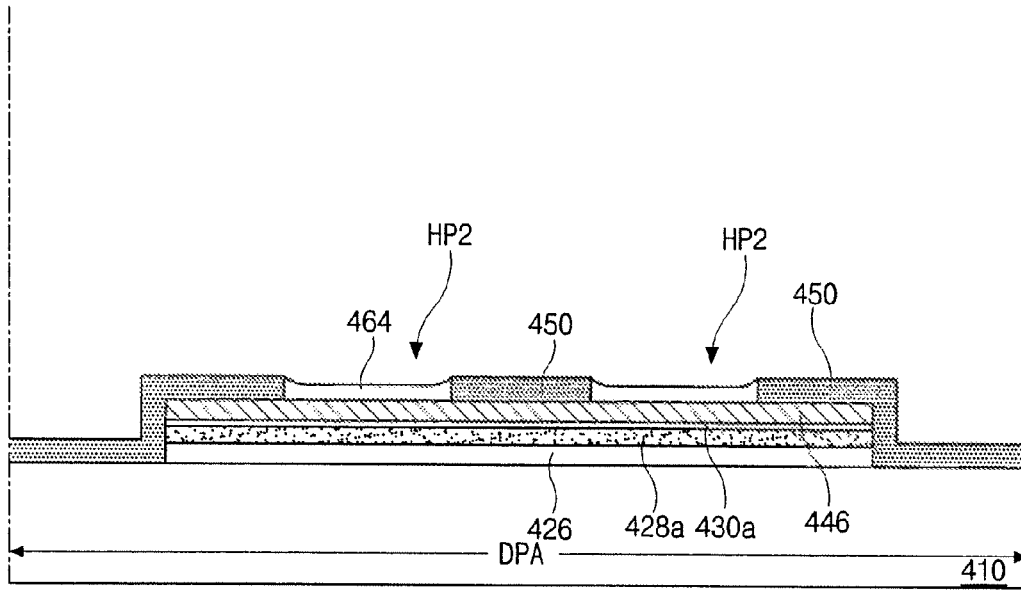

As a result of the lifting off process, referring to FIGS. 12F, 13F and 14F, a pixel electrode 460 connected to the drain electrode 444 is formed in the pixel region P. The gate pad electrode 462 contacting the gate pad 424 through the gate pad contact hole GPC is formed in the gate pad region GPA, and a data pad electrode contacting the data pad 446 and corresponding to the second groove HP2 is formed in the data pad region DPA. Also, the transparent conductive material layer 452 (of FIG. 13E) corresponding to the first groove HP1 remains to form a first lifting-off pattern 452a of an island shape. Although not shown, the transparent conductive material layer 452 (of FIGS. 13E and 13F) remains to form second to fourth lifting-off patterns having an island shape are formed in periphery of the data pad 446 and non-display regions facing the data pad region DPA and the gate pad region GPA.

The array substrate for the LCD device is fabricated by the above processes including the lifting off process according to the present invention.

Hereinafter, a method of fabricating an array substrate for an LCD device according to another embodiment using the above-mentioned lifting off process is explained. Elements similar to one shown in FIGS. 12A to 12H, 13A to 13H and 14A to 14H are explained in brief.

FIGS. 15A to 15H are cross-sectional views showing a fabricating process of a pixel region including a switching region according to the present invention, FIGS. 16A to 16H are cross-sectional views showing a fabricating process of a gate pad region according to the present invention, and FIGS. 17A to 17H are cross-sectional views showing a fabricating process of a data pad region according to the present invention.

Figure 15A:
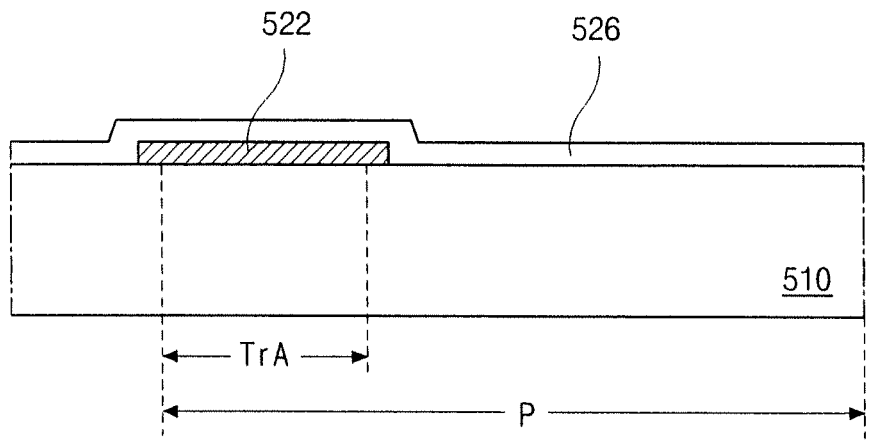
FIGS. 15A to 15H are cross-sectional views showing a fabricating process of a pixel region including a switching region according to the present invention.
Figure 16A:
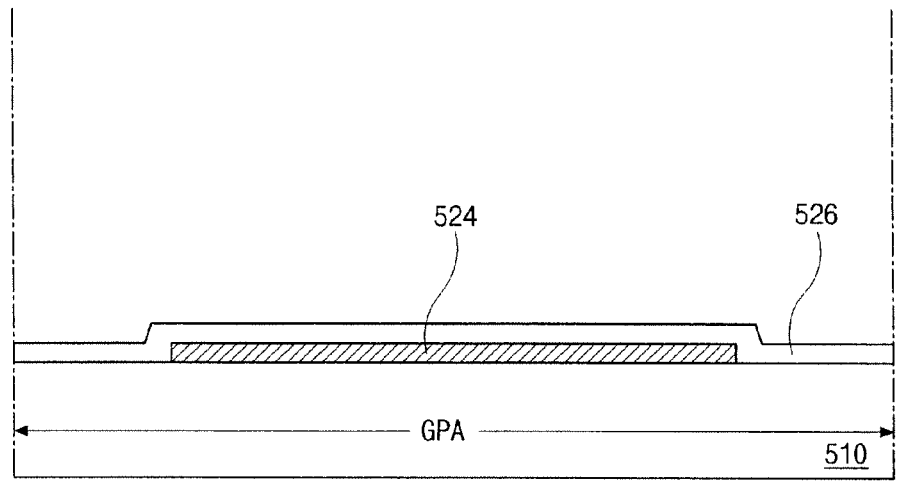
FIGS. 16A to 16H are cross-sectional views showing a fabricating process of a gate pad region according to the present invention.
Figure 17A:
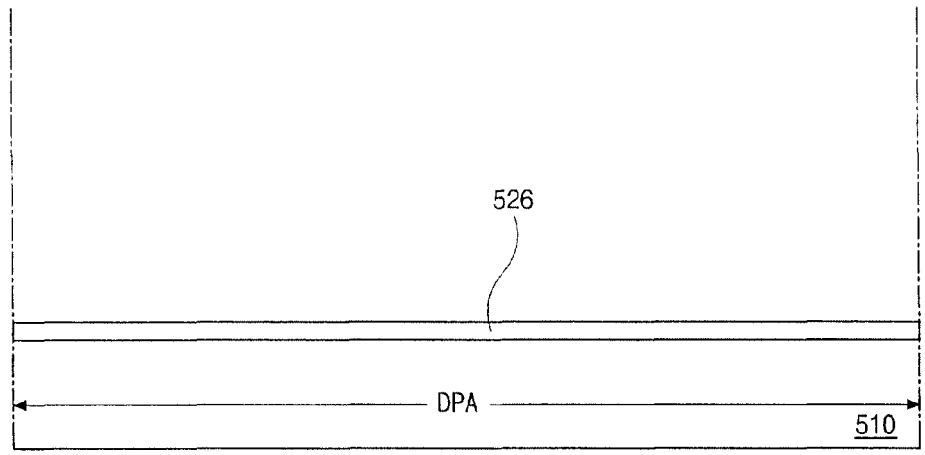
FIGS. 17A to 17H are cross-sectional views showing a fabricating process of a data pad region according to the present invention.

Referring to FIGS. 15A, 16A and 17A showing a first mask process, a first metal layer (not shown) is formed on a substrate 510. The first metal layer (not shown) is patterned to form a gate line (not shown), a gate electrode 522 extending from the gate line (not shown) into the switching region TrA and a gate pad 524 connected to the gate line (not shown) in the gate pad region GPA. Next, a gate insulating layer 526 is formed on an entire surface of the substrate including the gate line (not shown), the gate electrode 522 and the gate pad 524.

Figure 15B:
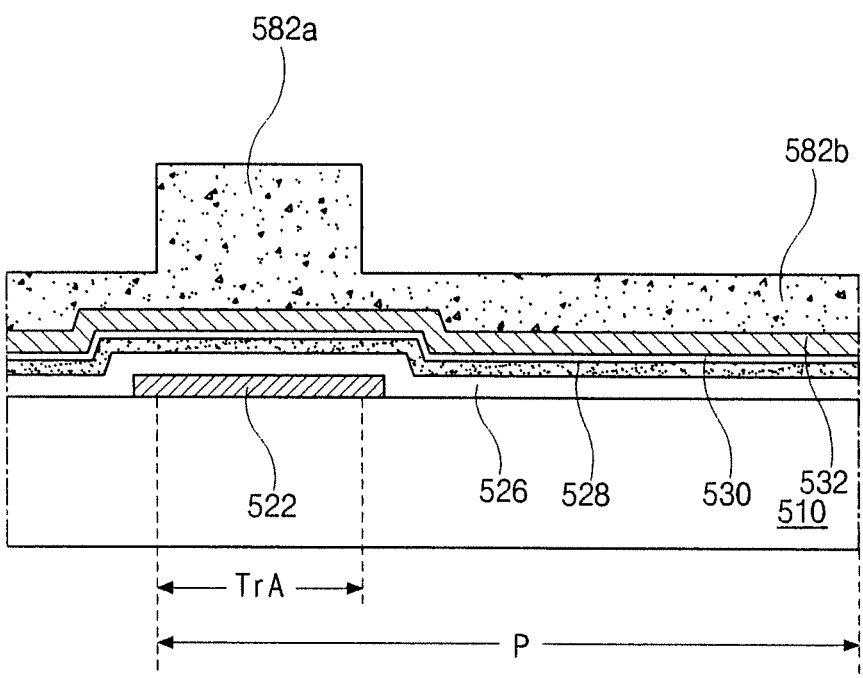
Figure 15C:
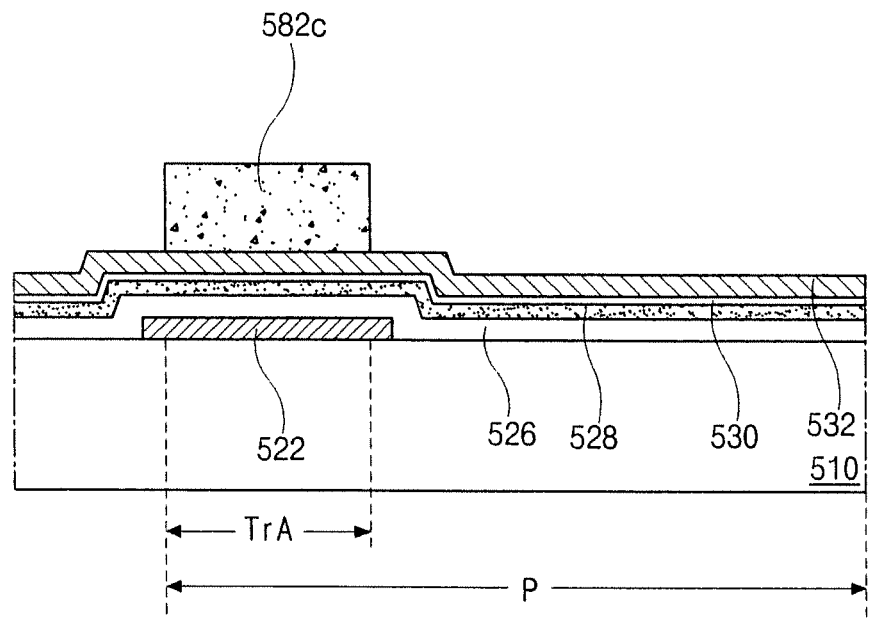
Figure 15D:
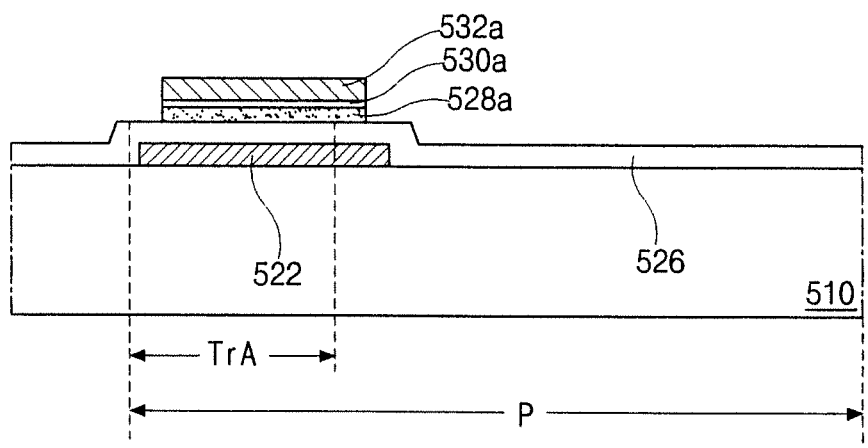
Figure 16B:
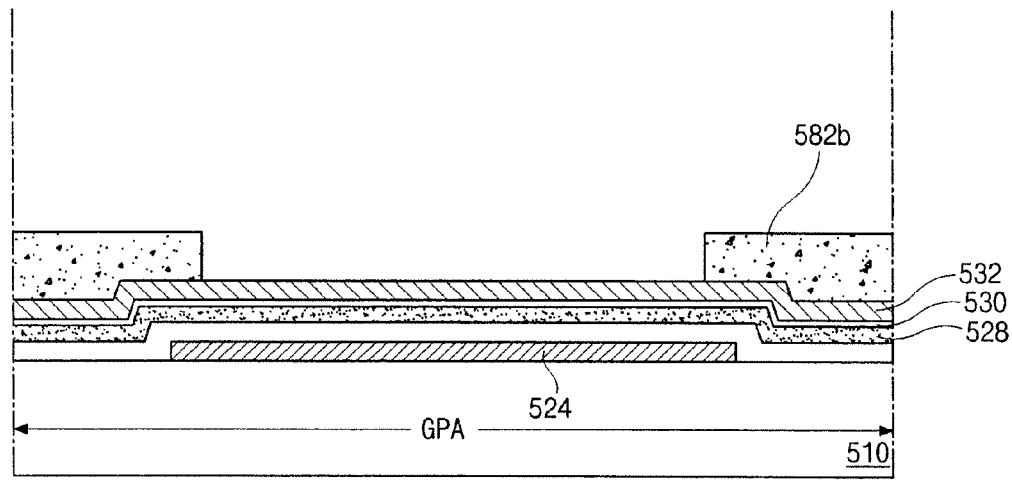
Figure 16C:
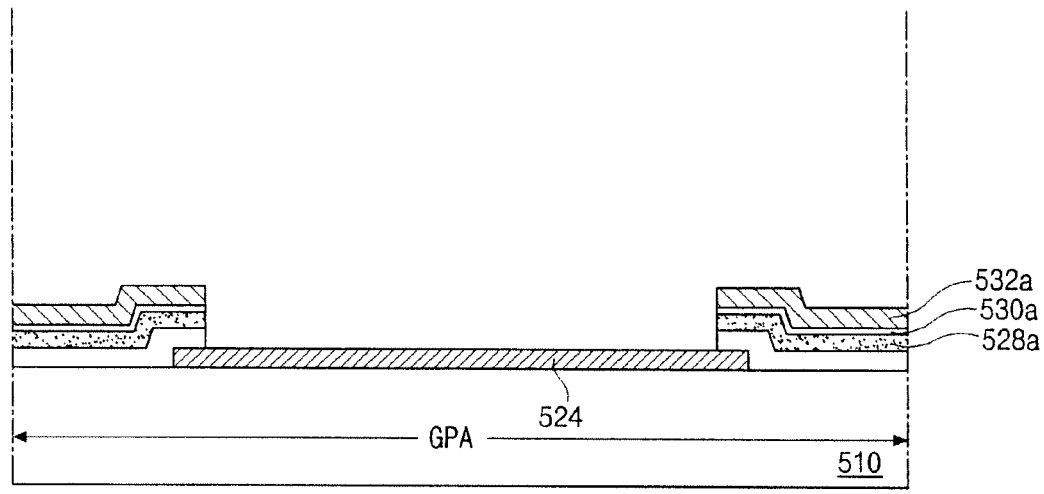
Figure 16D:
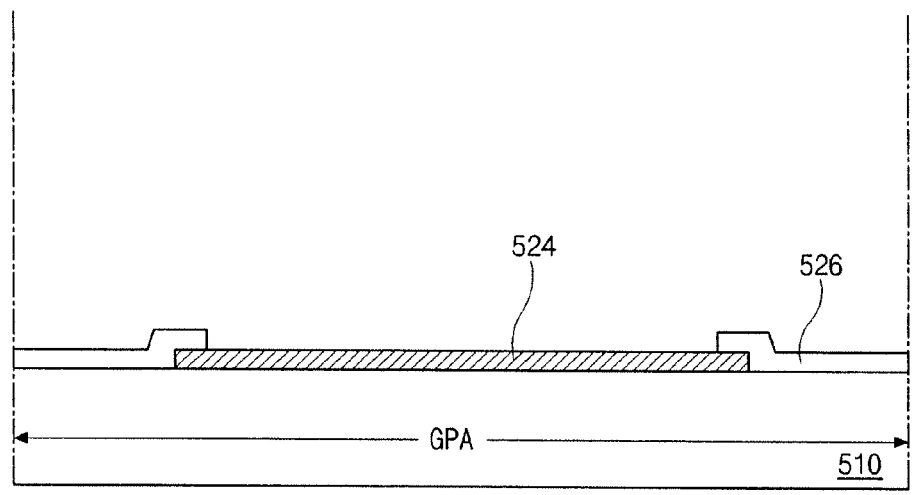
Figure 17B:
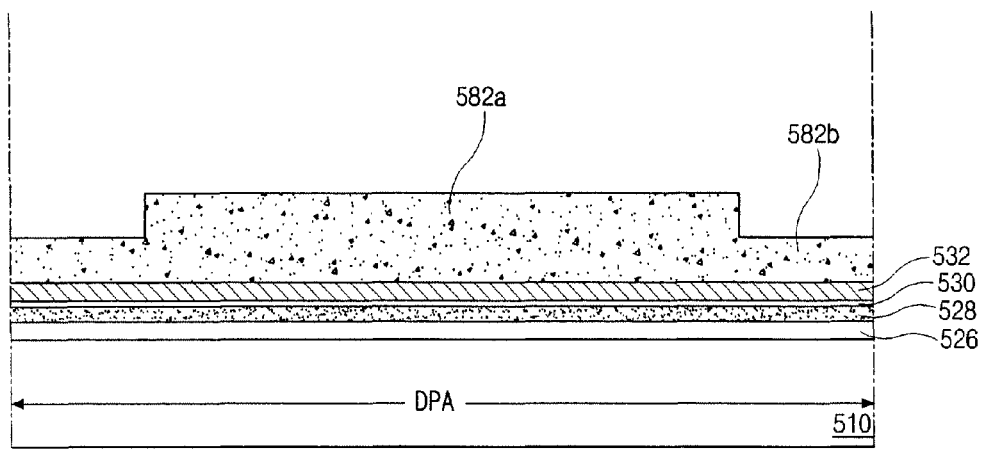

FIGS. 15B to 15D, 16B to 16D and 17B to 17D show a second mask process. Referring to FIGS. 15B, 16B and 17B, an intrinsic amorphous silicon layer 528, an impurity-doped amorphous silicon layer 530 and a second metal layer 532 are sequentially deposited on the gate insulating layer 526. A first PR layer 580 is formed on the second metal layer 532. The first PR layer 580 is patterned using a mask (not shown) including a transmissive area, a half-transmissive area and a blocking area to form first and second PR patterns 582a and 582b having different heights.

Figure 17C:
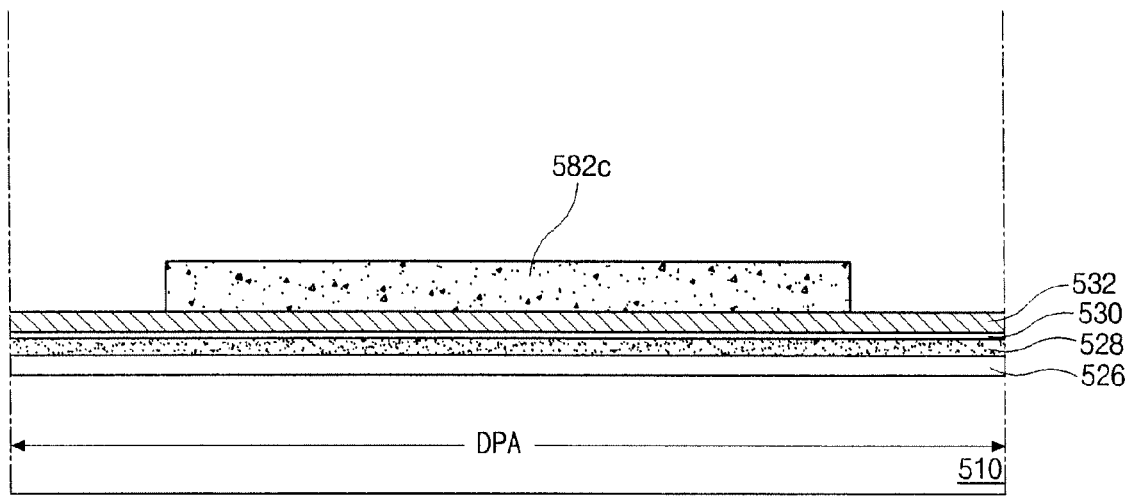

Next, referring to FIGS. 15C, 16C and 17C, the second metal layer 532 (of FIGS. 15B, 16B and 17B), and the impurity-doped amorphous silicon layer 530 (of FIGS. 15B, 16B and 17B), the intrinsic amorphous silicon layer 528 (of FIGS. 15B, 16B and 17B) and the gate insulating layer 526 are sequentially patterned using the first and second PR patterns 582a and 582b as a patterning mask to expose the gate pad 524. Next, an ashing process is performed to form a third PR pattern 582c. The second metal layer 532 (of FIGS. 15B, 16B and 17B) exposed by the third PR pattern 582c, the impurity-doped amorphous silicon layer 530 (of FIGS. 15B, 16B and 17B), the intrinsic amorphous silicon layer 528 (of FIGS. 15B, 16B and 17B) are patterned using the third PR pattern 582c such that a metallic material pattern 532a, an impurity-doped amorphous silicon pattern 530a and an intrinsic amorphous silicon pattern 528a are formed at both sides of the gate pad 524.

Figure 17D:
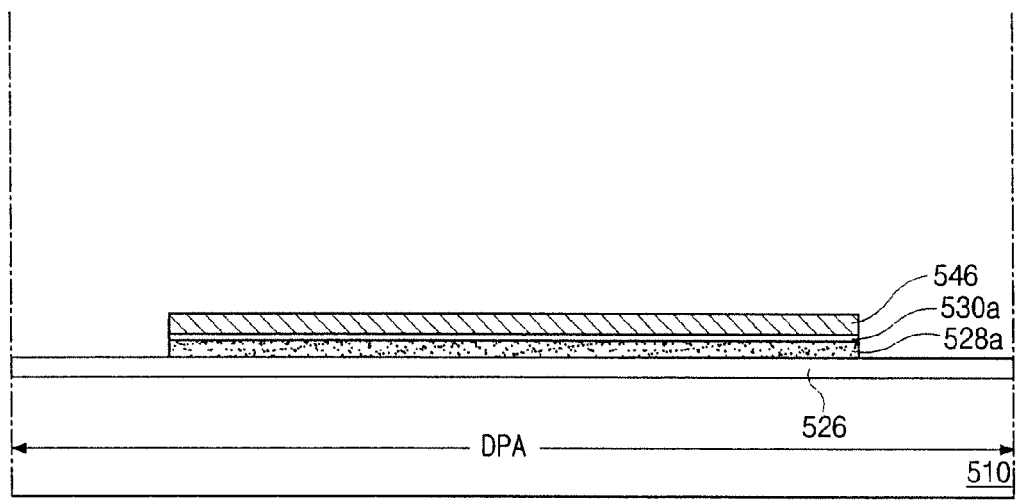

As a result, referring to FIGS. 15D, 16D and 17D, an intrinsic amorphous silicon pattern 528a, an impurity-doped amorphous silicon pattern 530a and a metallic material pattern 532a are stacked in the switching region TrA, and an intrinsic amorphous silicon pattern 528a, an impurity-doped amorphous silicon pattern 530a and a data pad 546 are stacked in the data pad region DPA.

Figure 15E:
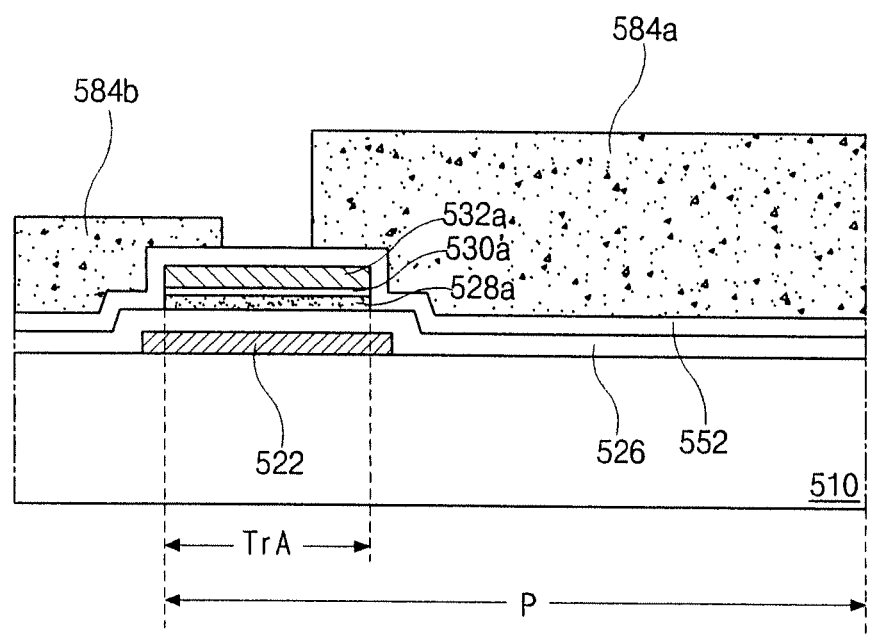
Figure 15F:
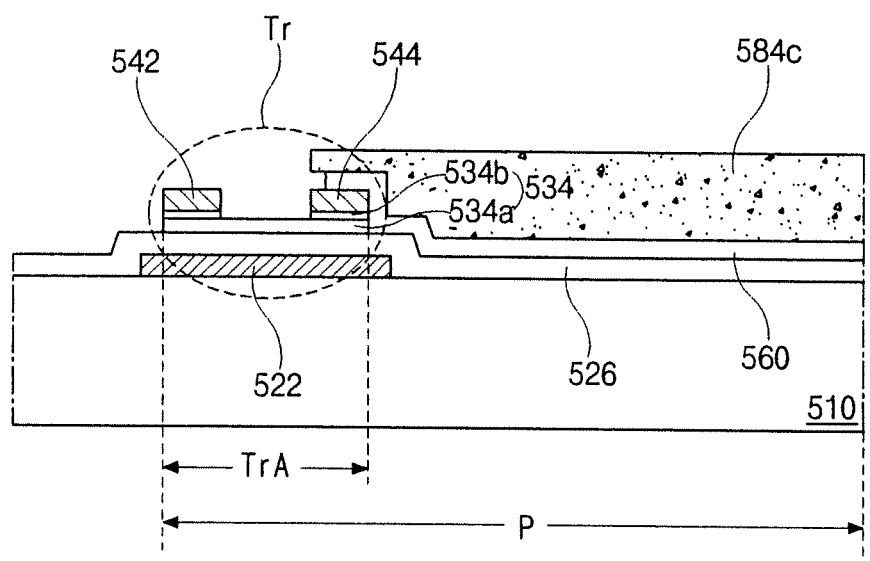
Figure 15G:
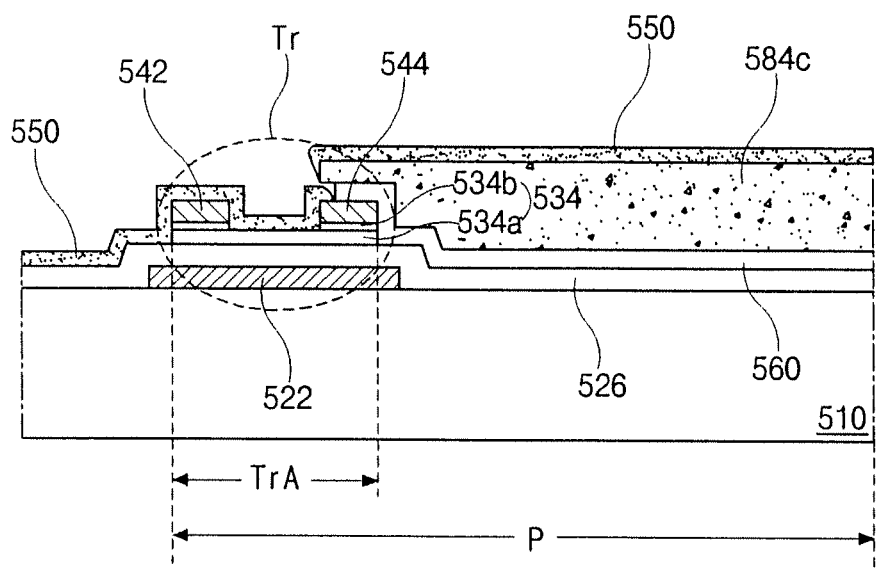
Figure 15H:
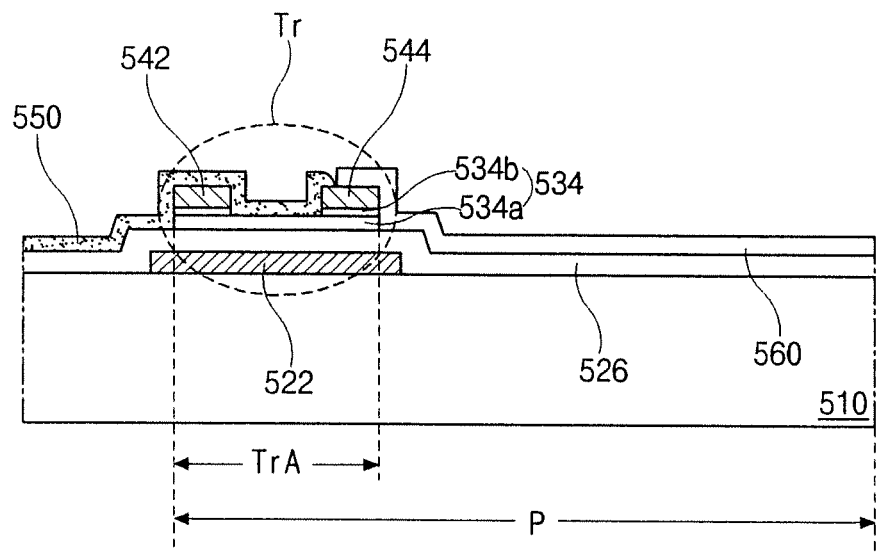
Figure 16E:
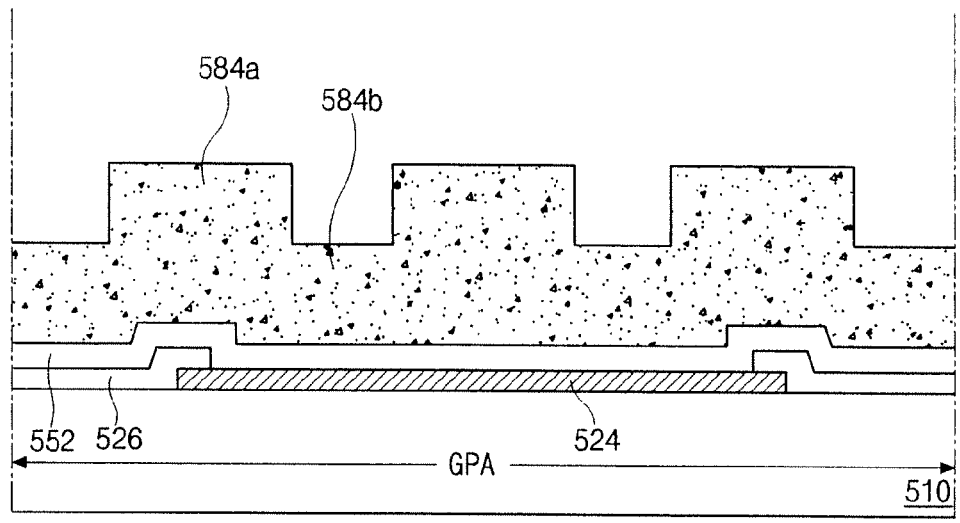
Figure 16F:
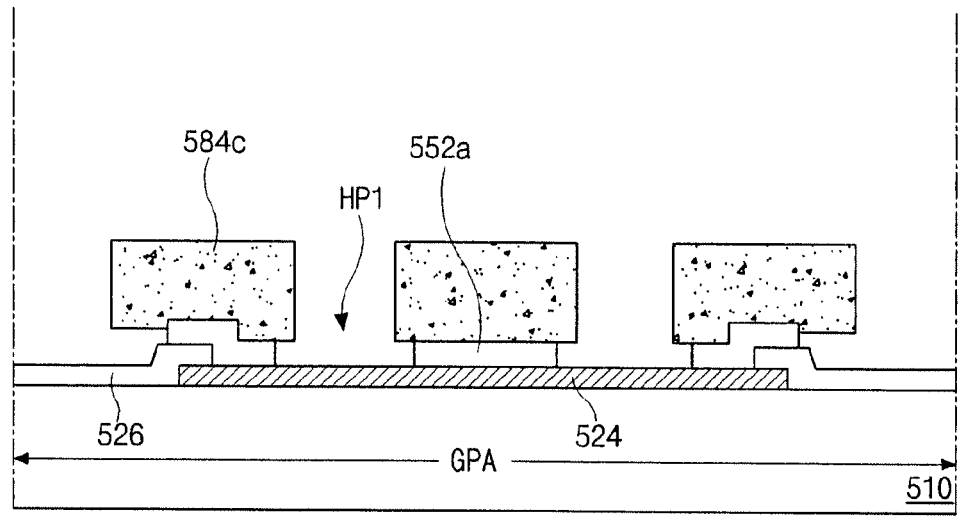
Figure 16G:
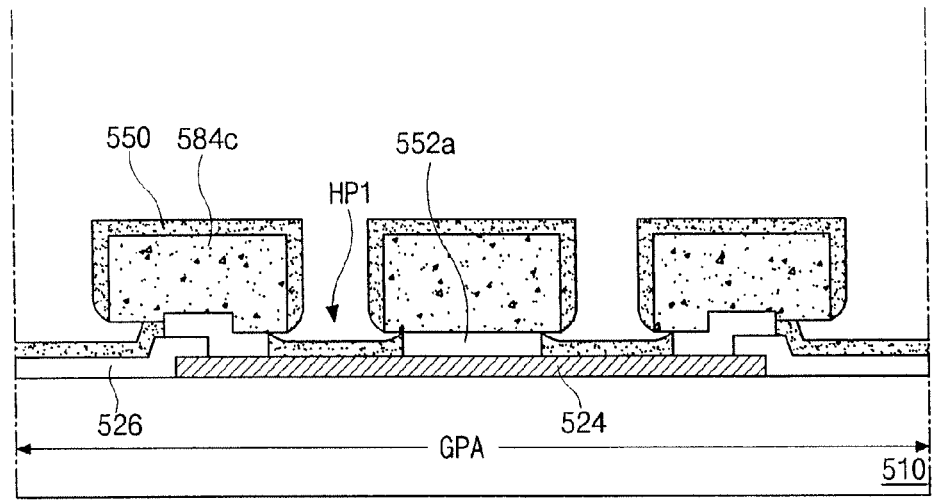
Figure 16H:
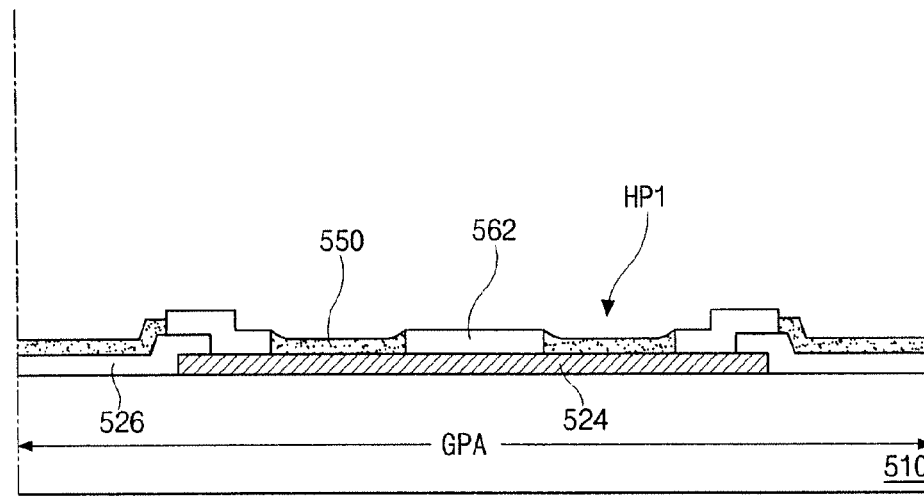
Figure 17E:
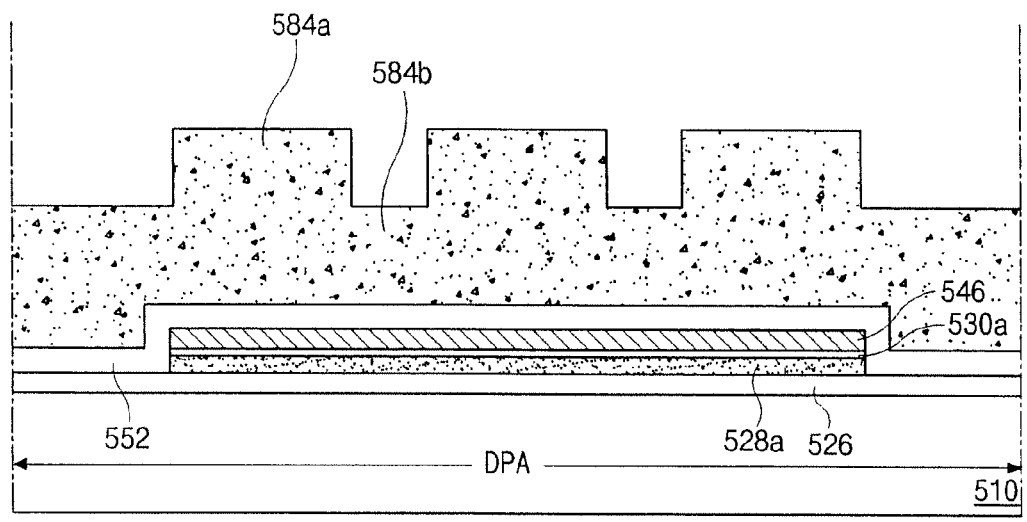

FIGS. 15E to 15H, 16E to 16H and 17E to 17H show a third mask process. Referring to FIGS. 15E, 16E and 17E, a transparent conductive material layer 552 is formed, and fourth and fifth PR patterns 584a and 584b having different heights is formed on the transparent conductive material layer 552.

Figure 17F:
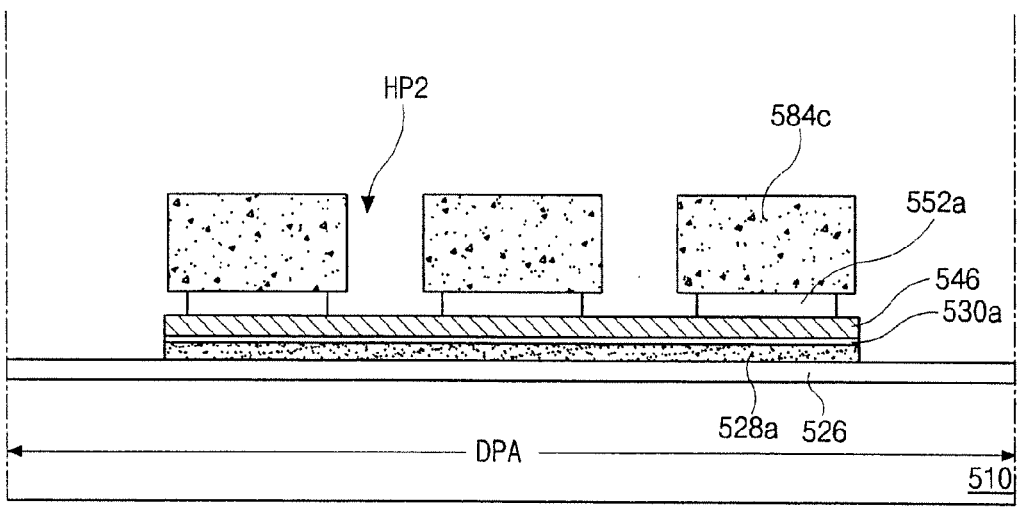

Next, referring FIGS. 15F, 16F and 17F, the transparent conductive material layer 552, the metallic material pattern 532a and the impurity-doped amorphous silicon pattern 530a are patterned using the fourth and fifth PR patterns 584a and 584b to form a source electrode 542, a drain electrode 544 spaced apart from the source electrode 542, an ohmic contact layer 534b under the source and drain electrodes 542 and 544, and an active layer 534a. The gate electrode 522, the gate insulating layer 526, a semiconductor layer 534 including the ohmic contact layer 534b and the active layer 534a, the source electrode 542 and the drain electrode 544 constitute a TFT Tr in the switching region TrA. Next, a sixth PR pattern 584c is formed from the fourth PR patterns 584a by an ashing process. Space between sixth PR patterns 584c on the gate pad 524 is defined as a first groove HP1, and space between sixth PR pattern 584c on the data pad 546 is defined as a second groove HP2. In drawings, it looks like portions of the sixth PR pattern 584c being separated from each other. However, the first and second grooves HP1 and HP2 correspond to holes in the sixth PR pattern 584c such that the sixth PR pattern 584c in each region has an integrated body as a whole. The transparent conductive material layer 552 (of FIGS. 15E, 16E and 17E) is patterned using the sixth PR pattern 584c to form a pixel electrode 560, which is connected to the drain electrode 544, and a transparent conductive material pattern 552a on the gate pad 524 and the data pad 546. In this case, since the transparent conductive material layer 552 (of FIGS. 15E, 16E and 17E) is over-etched, the sixth PR pattern 584c protrudes from end portion of the transparent conductive material pattern 552a.

Figure 17G:
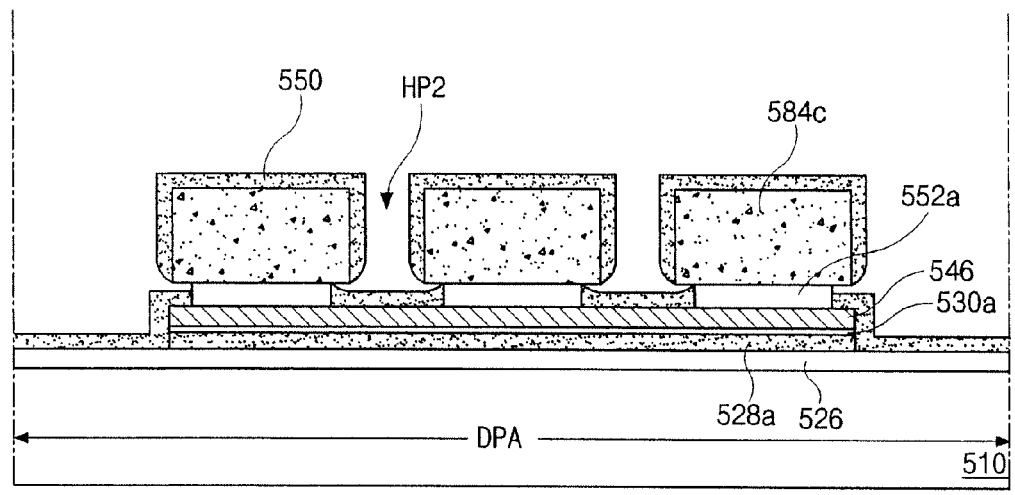

Next, referring to FIGS. 15G, 16G and 17G, a passivation layer 550 of silicon nitride or silicon oxide is formed by a sputtering method. Generally, the passivation layer of the LCD device is formed by depositing an inorganic insulating material through the plasma chemical vapor deposition method. However, because the plasma chemical vapor deposition method requires a relatively high temperature, for example, greater than about 350 degrees Celsius, there are some damages on the sixth PR patterns 584c. Accordingly, the passivation layer 550 is deposited by a sputtering method having a process temperature less than about 150 degrees Celsius.

Since there are discontinuations in the passivation layer 550 at boundary between the pixel electrode 560 and the sixth PR pattern 584c and between the transparent conductive material pattern 552a and the sixth PR pattern 584c, the stripper is penetrated through the discontinuations into the sixth PR pattern 584c in the lifting off process. As a result, the sixth PR pattern 584c and the passivation layer 550 on the sixth PR pattern 584c are removed at the same time. Particularly, the lifting off process has an powerful effect in the gate pad 526 and the data pad 546, which have a width above about 200 micrometers, due to the first and second grooves HP1 and HP2.

Figure 17H:
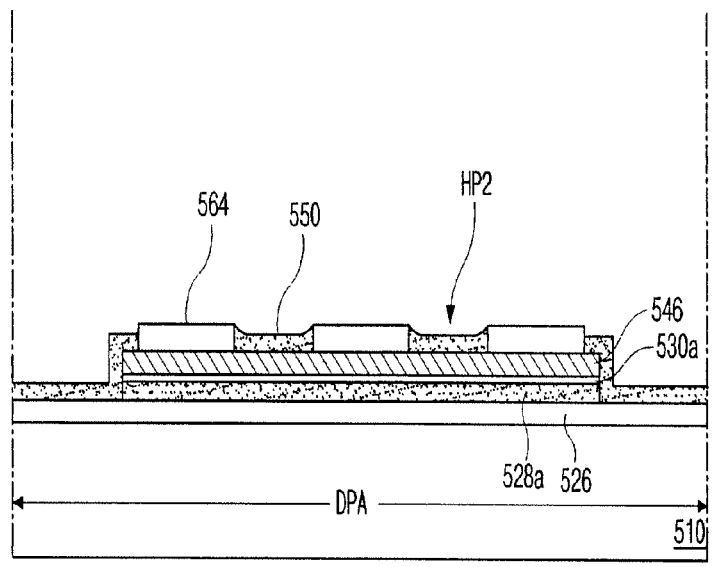

Referring to FIGS. 15H, 16H and 17H, the passivation layer 550 in the switching region TrA covers and protects the exposed portion of the active layer 534a. The passivation layer 550 corresponding to the first groove HP1 remains in the gate pad region GPA. The gate pad electrode 562, which is disposed between the first grooves HP1 and formed of the transparent conductive material, contacts the gate pad 526. Moreover, the passivation layer 550 corresponding to the second groove HP2 remains in the data pad region DPA. The data pad electrode 564, which is disposed between the second grooves HP2 and formed of the transparent conductive material, contacts the data pad 546.

When a line or a pattern having a relatively great width, for example, above about 200 micrometers, is fabricated by a lifting off method according to the present invention, problems, for example, remaining PR patterns, are prevented due to a plurality of grooves.

Moreover, since a material layer, which is disposed on PR patterns, is deposited by a sputtering method having a relatively low process temperature, there is no damage on the PR patterns.

Furthermore, an array substrate for a liquid crystal layer having improved qualities is fabricated using the lifting off process.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating an array substrate for a liquid crystal display device, comprising:
   forming a gate line and a gate electrode on a substrate, the substrate having a display region and first to fourth non-display regions at periphery of the display region, the gate electrode being disposed in the display region;
   forming a data line, a data pad, a semiconductor layer, a source electrode and a drain electrode on the substrate, the data line crossing the gate line, the data pad disposed at one end of the data line and in the first non-display region, the semiconductor layer disposed over the gate electrode, the source electrode connected to the data line and disposed on the semiconductor layer, the drain electrode spaced apart from the source electrode and disposed on the semiconductor layer;

forming an insulating material layer over an entire surface of the substrate including the data line, the data pad, the source electrode and the drain electrode;

forming a first photoresist pattern corresponding to the source and drain electrode, and a second photoresist pattern having first and second holes, the first photoresist pattern exposing a portion of the drain electrode, the first and second holes respectively corresponding to first and second portions of the data pad;

patterning the insulating material layer by using the first and second photoresist patterns as a patterning mask to form a passivation layer exposing the portion of the drain electrode and a first passivation pattern having first and second grooves, the first and second grooves exposing the first and second portions of the data pad, respectively;

forming a conductive material layer over an entire surface of the substrate including the first and second photoresist patterns, the passivation layer and the first passivation pattern; and removing the first and second photoresist patterns and the conductive material layer on the first and second photoresist patterns at the same time by a lifting off process.

2. The method according to claim 1, wherein the conductive material layer is a transparent conductive material or an opaque metallic conductive material.

3. The method according to claim 1, wherein each of the data pad and the second, third and fourth non-display regions has a width greater than 200 micrometers.

4. The method according to claim 1, wherein the step of forming the first and second photoresist patterns comprises forming a third photoresist pattern having third and fourth holes, the third and fourth holes corresponding to third and fourth portions, respectively, in each of the second, third and fourth non-display regions;

the step of patterning the insulating material layer comprises forming a second passivation pattern having third and fourth grooves, the third and fourth grooves exposing the third and fourth portions, respectively, in each of the second, third and fourth non-display regions; and the step of lifting off comprises removing the third photoresist pattern and the conductive material layer on the third photoresist pattern.

5. The method according to claim 4, wherein each of the first, second, third and fourth grooves includes one of a bar shape, a saw tooth shape, a cross shape, and a  shape.

6. A method of fabricating an array substrate for a liquid crystal display device, comprising:

forming a gate line and a gate pad on a substrate, the gate pad disposed at one end of the gate line;

sequentially forming a gate insulating layer, an intrinsic amorphous silicon layer, an impurity-doped amorphous silicon layer and a metal layer over an entire surface of the substrate including the gate line and the gate pad;

patterning the metal layer, the impurity-doped amorphous silicon layer, the intrinsic amorphous silicon layer and the gate insulating layer to expose the gate pad and form a data line crossing the gate line to define a pixel region and a data pad disposed at one end of the data line;

forming a conductive material layer over an entire surface of the substrate including the data line and the data pad;

forming a first photoresist pattern including first and second holes and a second photoresist pattern including third and fourth holes, the first and second holes corresponding to first and second portions of the gate pad, respectively, the third and fourth holes corresponding to third and fourth portions of the data pad, respectively;

patterning the conductive material layer using the first and second photoresist patterns as a patterning mask to form a first conductive material pattern having first and second grooves and a second conductive material pattern having third and fourth grooves, the first and second grooves exposing the first and second portions, respectively, of the gate pad, the third and fourth grooves exposing the third and fourth portions, respectively, of the data pad;

forming a passivation layer over an entire surface of the substrate including the first and second photoresist patterns and the first, second, third and fourth grooves; and removing the first and second photoresist patterns and the passivation layer on the first and second photoresist patterns at the same time by a lifting off process.

7. The method according to claim 6, wherein the conductive material layer is a transparent conductive material or an opaque metallic conductive material.

8. The method according to claim 6, wherein the step of forming the gate line and the gate pad comprises forming a gate electrode connected to the gate line;

the step of patterning the metal layer, the impurity-doped amorphous silicon layer, the intrinsic amorphous silicon layer and the gate insulating layer comprises forming an intrinsic amorphous silicon pattern, an impurity-doped amorphous silicon pattern and a metal pattern stacked over the gate electrode;

the step of forming the first and second photoresist patterns comprises forming a third photoresist pattern exposing a center of the metal pattern;

the step of patterning the conductive material layer comprises removing the exposed metal pattern and a portion of the impurity-doped amorphous silicon pattern and forming a pixel electrode in the pixel region and connected to a portion of the metal pattern; and the step of removing the first and second photoresist patterns and the passivation layer comprises removing the third photoresist pattern and the passivation layer on the third photoresist pattern.

9. The method according to claim 6, wherein each of the first, second, third and fourth grooves includes one of a bar shape, a saw tooth shape, a cross shape, and a  shape.

10. The method according to claim 6, wherein each of the gate pad and the data pad has a width greater than 200 micrometers.

11. The method according to claim 10, wherein the step of forming the passivation layer by a sputtering method.

* * * * *